US012464869B2

(12) United States Patent
Chen et al.

(10) Patent No.: US 12,464,869 B2
(45) Date of Patent: Nov. 4, 2025

(54) LIGHT-EMITTING ELEMENT WITH A CUSHION PART

(71) Applicant: EPISTAR CORPORATION, Hsinchu (TW)

(72) Inventors: Chao-Hsing Chen, Hsinchu (TW); Tsung-Hsun Chiang, Hsinchu (TW); Chien-Chih Liao, Hsinchu (TW); Wen-Hung Chuang, Hsinchu (TW); Min-Yen Tsai, Hsinchu (TW); Bo-Jiun Hu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 18/638,220

(22) Filed: Apr. 17, 2024

(65) Prior Publication Data

US 2024/0266476 A1    Aug. 8, 2024

Related U.S. Application Data

(63) Continuation of application No. 17/241,958, filed on Apr. 27, 2021, now Pat. No. 12,002,904, which is a
(Continued)

(51) Int. Cl.
*H01L 23/00*    (2006.01)
*H10H 20/81*    (2025.01)
(Continued)

(52) U.S. Cl.
CPC .......... *H10H 20/84* (2025.01); *H01L 23/562* (2013.01); *H10H 20/81* (2025.01);
(Continued)

(58) Field of Classification Search
CPC .... H10H 20/80; H10H 20/81; H10H 20/8131; H10H 20/815; H10H 20/83;
(Continued)

(56) References Cited

U.S. PATENT DOCUMENTS 9,721,912 B2    8/2017    Khandekar et al.
2002/0137245 A1    9/2002    Kitamura et al.
(Continued)

FOREIGN PATENT DOCUMENTS

CN    101154602 A    4/2008
CN    103119735 A2    5/2013
(Continued)

*Primary Examiner* — William B Partridge
*Assistant Examiner* — Gustavo G Ramallo
(74) *Attorney, Agent, or Firm* — DITTHAVONG, STEINER & MLOTKOWSKI

(57) ABSTRACT

A light-emitting element includes a semiconductor light-emitting stack including a first semiconductor layer, a second semiconductor layer formed on the first semiconductor layer, and an active layer formed therebetween; a first conductive layer disposed on the second semiconductor layer and electrically connecting the second semiconductor layer; a second conductive layer disposed on the second semiconductor layer and electrically connecting the first semiconductor layer; and a cushion part disposed on and directly contacts the first conductive layer, wherein in a top view, the cushion part is surrounded by and electrically isolated from the second conductive layer.

20 Claims, 21 Drawing Sheets

Related U.S. Application Data continuation of application No. 16/182,241, filed on Nov. 6, 2018, now Pat. No. 10,991,854, which is a continuation of application No. 15/669,613, filed on Aug. 4, 2017, now Pat. No. 10,153,402, which is a continuation of application No. 14/948,733, filed on Nov. 23, 2015, now Pat. No. 9,761,774.

(60) Provisional application No. 62/092,422, filed on Dec. 16, 2014.

(51) Int. Cl.
    *H10H 20/831*      (2025.01)
    *H10H 20/832*      (2025.01)
    *H10H 20/84*      (2025.01)
    *H10H 20/857*      (2025.01)

(52) U.S. Cl.
    CPC ........ *H10H 20/831* (2025.01); *H10H 20/832* (2025.01); *H10H 20/857* (2025.01)

(58) Field of Classification Search
    CPC ............. H10H 20/831; H10H 20/8312; H10H 20/8314; H10H 20/8316
    See application file for complete search history.

(56) References Cited

U.S. PATENT DOCUMENTS

| | | | |
|---|---|---|---|
| 2004/0195579 A1* | 10/2004 | Sonobe | H10H 20/825 257/99 |
| 2006/0169994 A1 | 8/2006 | Tu et al. | |
| 2008/0081399 A1 | 4/2008 | Takano et al. | |
| 2010/0012963 A1* | 1/2010 | Hwan | H10H 20/8312 257/E33.045 |
| 2010/0163887 A1 | 7/2010 | Kim et al. | |
| 2010/0308347 A1 | 12/2010 | Yeh et al. | |
| 2011/0140078 A1* | 6/2011 | Hsu | H01L 25/0753 257/E33.068 |
| 2012/0074441 A1* | 3/2012 | Seo | H10H 20/814 257/E33.068 |
| 2014/0353708 A1 | 12/2014 | Seo et al. | |
| 2015/0372208 A1 | 12/2015 | Chae et al. | |
| 2016/0284941 A1 | 9/2016 | Seo et al. | |
| 2019/0140143 A1* | 5/2019 | Pfeuffer | H10H 20/857 |

FOREIGN PATENT DOCUMENTS

| | | |
|---|---|---|
| CN | 103403889 A | 11/2013 |
| TW | 201332155 A | 8/2013 |
| TW | 201336116 A | 9/2013 |

\* cited by examiner

1

|  | testing quantity | short circuit ratios |
|---|---|---|
| conventional light-emitting element | 234 | 33% |
| light-emitting element of the first embodiment | 846 | 0% |

LIGHT-EMITTING ELEMENT WITH A CUSHION PART

REFERENCE TO RELATED APPLICATION

This application is a continuation application of U.S. patent application Ser. No. 17/241,958, filed on Apr. 27, 2021, now pending, which is a continuation application of U.S. patent application Ser. No. 16/182,241, filed on Nov. 6, 2018, now granted, which is a continuation application of U.S. patent application Ser. No. 15/669,613, filed on Aug. 4, 2017, now granted, which is a continuation application of U.S. Pat. No. 9,761,774, filed on Nov. 23, 2015, now granted, claiming the right of priority based on U.S. 62/092,422, filed on Dec. 16, 2014, and the contents of which are hereby incorporated by reference in the entireties.

TECHNICAL FIELD

The disclosure is related to a light-emitting element, and more particularly, a light-emitting element with a cushion part.

DESCRIPTION OF THE RELATED ART

During LED chip package process, LED chips are detached from a blue tape by an ejector pin, picked and placed on a predetermined mounting place one by one via a vacuum chuck. Referring to FIGS. 1A~2C, FIG. 1A shows a top view of a conventional flip chip LED 1. FIG. 1B shows a cross-sectional view of the conventional flip chip LED 1, attached on a blue tape 23, along a line A-A' of FIG. 1A and an ejector pin 21 pushing the blue tape 23 and the conventional flip chip LED 1. The ejector pin 21 can punch through the blue tape 23 and press on a surface of the conventional flip chip LED 1. As shown in FIGS. 1A~1B, the conventional flip chip LED 1 includes a light-emitting stack 10 including a p-type semiconductor layer, a n-type semiconductor layer, and an active layer disposed between the p-type semiconductor layer and the n-type semiconductor layer (not shown), a first pad 15 electrically connecting the n-type semiconductor layer, and a second pad 16 electrically connecting the p-type semiconductor layer. Herein, the ejector pin 21 can be applied to the flip chip LED 1 to detach the flip chip LED 1 from the blue tape 23 which covers an entire top surface of the flip chip LED 1. In detail, the ejector pin 21 is attached to a center region of the flip chip LED 1 located between the first pad 15 and the second pad 16 called gap area 151 for lifting and detaching the flip chip LED 1 from the blue tape 23, and thus the flip chip LED 1 is damaged due to the detaching.

FIG. 2A shows a picture of the conventional flip chip LED 1 damaged due to the detaching, FIG. 2B shows an enlarged partial top view of region C in FIG. 2A, and FIG. 2C shows an enlarged partial top view of region D in FIG. 2B. Since mechanical strength of the flip chip LED 1 is not strong enough, when the ejector pin 21 pushes the flip chip LED 1, the ejector pin 21 will damage the flip chip LED 1 and result in chip damage such as cracks 27 produced in the flip chip LED 1. When current injects into the flip chip LED 1, the crack damage causes short circuits in the flip chip LED 1. The reliability of the flip chip LED 1 will be affected due to the damage accordingly.

SUMMARY OF THE DISCLOSURE

A light-emitting element includes a semiconductor light-emitting stack including a first semiconductor layer, a second semiconductor layer formed on the first semiconductor layer, and an active layer formed therebetween; a first conductive layer disposed on the second semiconductor layer and electrically connecting the second semiconductor layer; a second conductive layer disposed on the second semiconductor layer and electrically connecting the first semiconductor layer; and a cushion part disposed on and directly contacts the first conductive layer, wherein in a top view, the cushion part is surrounded by and electrically isolated from the second conductive layer.

A light-emitting element includes a semiconductor light-emitting stack including a first semiconductor layer, a second semiconductor layer formed on the first semiconductor layer, and an active layer formed therebetween; a first conductive layer disposed on the second semiconductor layer and electrically connecting the second semiconductor layer; a second conductive layer disposed on the second semiconductor layer, electrically connecting the first semiconductor layer and including two extension parts; an insulating structure disposed on the first conductive layer and/or the second conductive layer; and a cushion part disposed on the active layer and electrically connecting to the first conductive layer, wherein in a top view, the cushion part is clamped by the two extension parts of the second conductive layer.

A light-emitting element includes a semiconductor light-emitting stack having a first semiconductor layer with a first conductivity, an active layer, and a second semiconductor layer with a second conductivity, a first conductive layer disposed on the semiconductor light-emitting stack and electrically connecting the second semiconductor layer, a first insulating layer disposed on the first conductive layer, a second conductive layer disposed on the first insulating layer and electrically connecting the first semiconductor layer, a second insulating layer on the second conductive layer, a first pad, a second pad, and a cushion part. Herein, the first pad and the second pad are disposed on the second insulating layer, and a cushion part disposed between the first pad and the second pad.

A light-emitting element includes a semiconductor light-emitting stack including a first semiconductor layer, an active layer, and a second semiconductor layer; a first conductive layer disposed on the second semiconductor layer and electrically connecting the second semiconductor layer; a second conductive layer disposed on the second semiconductor layer and electrically connecting the first semiconductor layer; and a cushion part disposed on the semiconductor light-emitting stack; wherein in a top view, the cushion part is disposed in a center region of the light-emitting element.

A light-emitting element includes a semiconductor light-emitting stack including a first semiconductor layer, an active layer, and a second semiconductor layer; a first conductive layer disposed on the second semiconductor layer and electrically connecting the second semiconductor layer; a second conductive layer disposed on the first semiconductor layer and electrically connecting the first semiconductor layer; a first insulating layer disposed on the first conductive layer; a second insulating layer disposed on the second conductive layer; and a cushion part disposed on the active layer and electrically connecting the first conductive layer, wherein a portion of the cushion part is surrounded by the second conductive layer.

A light-emitting element includes a semiconductor light-emitting stack including a first semiconductor layer, a second semiconductor layer formed on the first semiconductor layer, and an active layer formed therebetween; a first insulating layer disposed on the second semiconductor layer; a first pad disposed on the first insulating layer and electrically connecting to the first semiconductor layer; a second pad disposed on the first insulating layer and electrically connecting to the second semiconductor layer; and a cushion part disposed on the first insulating layer and between the first pad and the second pad, wherein a material of the cushion part includes insulating material or transparent material; wherein the cushion part includes a first top surface, one of the first pad and the second pad includes a second top surface, the first top surface is below the second top surface in a cross-sectional view.

BRIEF DESCRIPTION OF THE DRAWING

The accompanying drawing is included to provide easy understanding of the application, and is incorporated herein and constitutes a part of this specification. The drawing illustrates the embodiment of the application and, together with the description, serves to illustrate the principles of the application.

FIG. 14 shows testing data related to short-circuit ratios of light-emitting elements of the first embodiment and the conventional light-emitting element.

DETAILED DESCRIPTION OF THE EMBODIMENTS

Figure 1A:
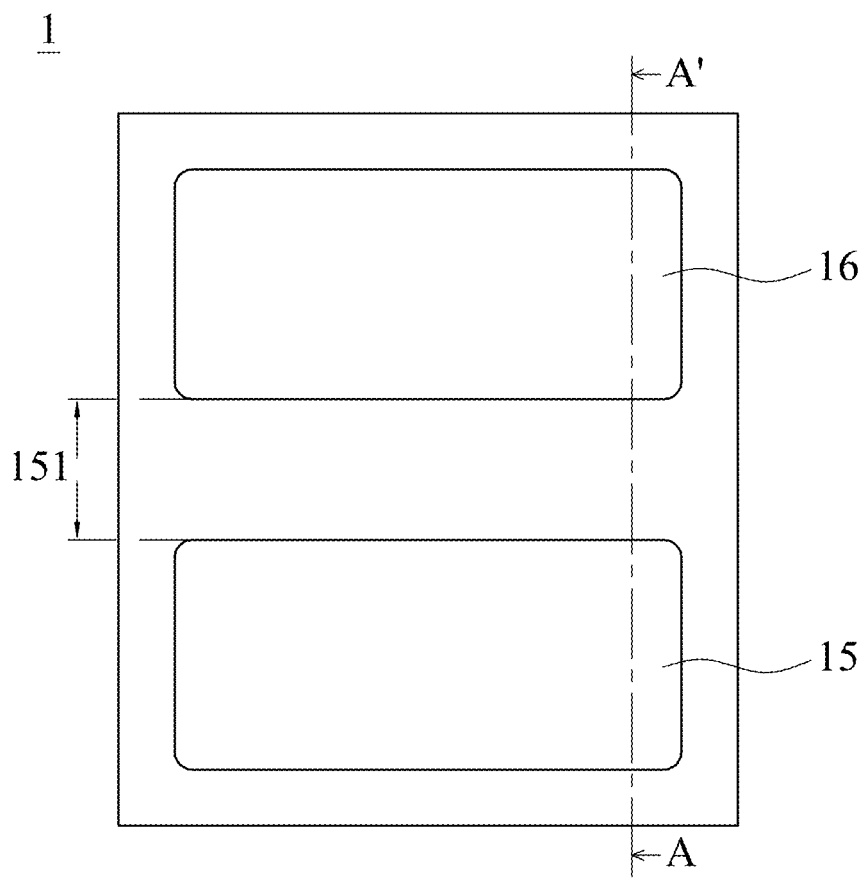
FIG. 1A shows a top view of a conventional flip chip LED.
Figure 1B:
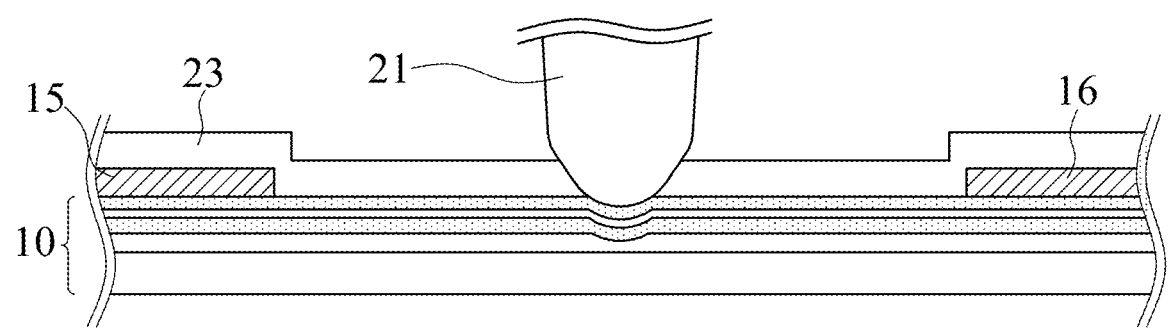
FIG. 1B shows a cross-sectional view of the conventional flip chip LED, attached on a blue tape, along a line A-A' of FIG. 1A and an ejector pin pushing the blue tape and the conventional flip chip LED.
Figure 2A:
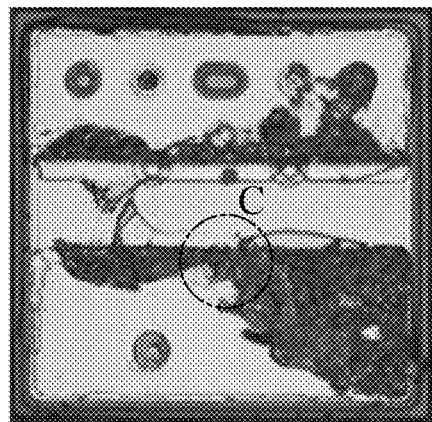
FIG. 2A shows a picture of the conventional flip chip LED damaged due to the detaching.
Figure 2B:
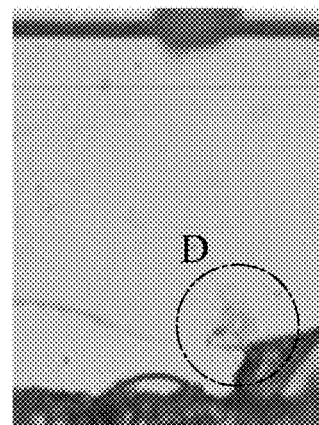
FIG. 2B shows an enlarged partial top view of region C in FIG. 2A.
Figure 2C:
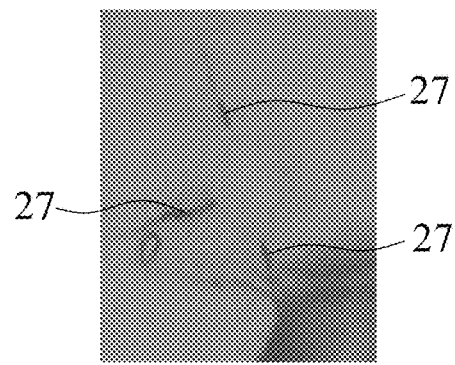
FIG. 2C shows an enlarged partial top view of region D in FIG. 2B.

To better and concisely explain the application, the same name or the same reference number given or appeared in different paragraphs or figures along the specification should has the same or equivalent meanings while it is once defined anywhere of the application.

The following shows the description of embodiments of the application in accordance with the drawing.

Figure 3A:
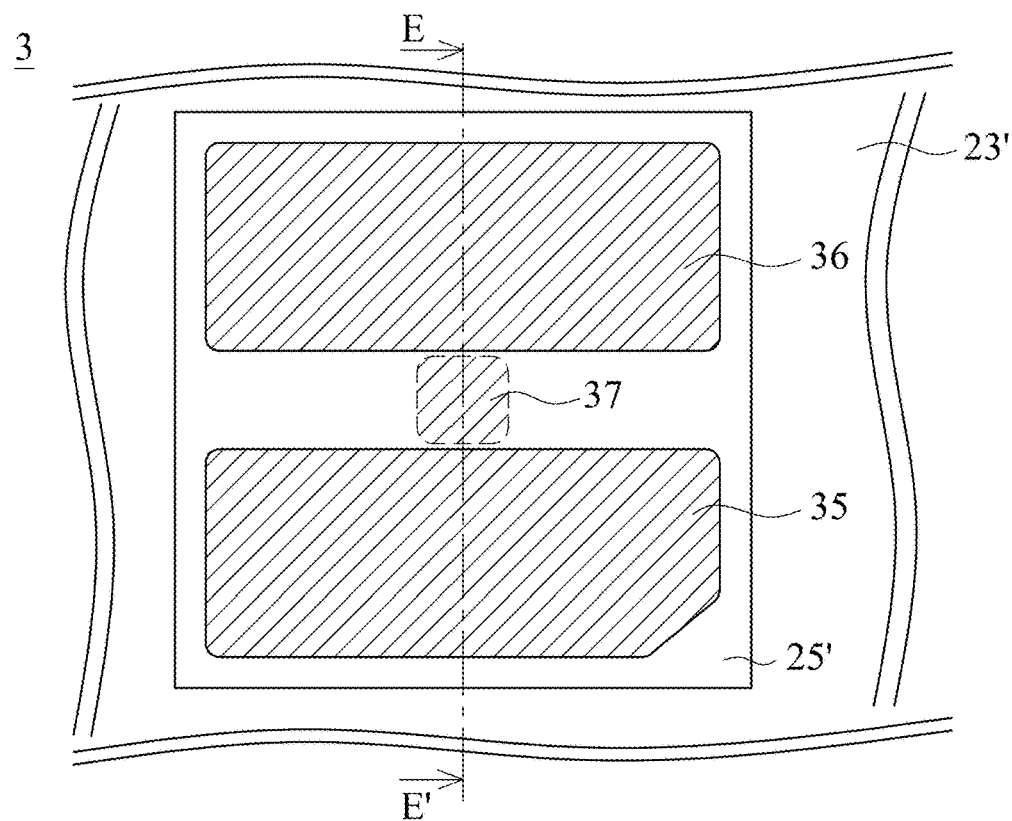
FIG. 3A shows a top view of a light-emitting element in accordance with a first embodiment of the application.
Figure 3B:
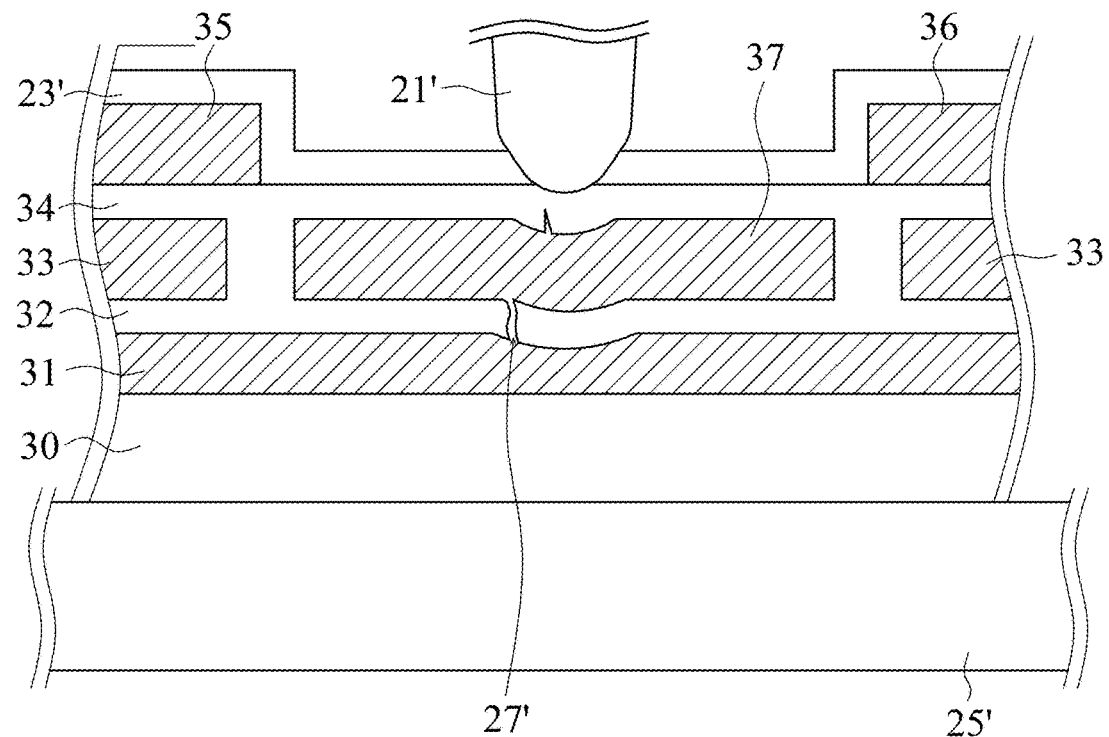
FIG. 3B shows a cross-sectional view of the light-emitting element along a line E-E' of FIG. 3A.

Referring to FIGS. 3A~3B, FIG. 3A shows a top view of a light-emitting element 3 in accordance with a first embodiment of the application. FIG. 3B shows a cross-sectional view of the light-emitting element 3 along a line E-E' of FIG. 3A. The light-emitting element 3 is adhered on a blue tape 23' and an ejector pin 21' presses on it through the blue tape 23'. As shown in FIGS. 3A~3B, the blue tape 23' covers an entire top surface of the light-emitting element 3. The light-emitting element 3 includes a semiconductor light-emitting stack 30 on a substrate 25', a first conductive layer 31 on the semiconductor light-emitting stack 30, a first insulating layer 32 on the first conductive layer 31, a second conductive layer 33 on the first insulating layer 32 electrically isolated from the first conductive layer 31, a second insulating layer 34 on the second conductive layer 33, a first pad 35, a second pad 36, and a cushion part 37 interposed between the first insulating layer 32 and the second insulating layer 34. The semiconductor light-emitting stack 30 includes a first semiconductor layer with a first conductivity, an active layer, and a second semiconductor layer with a second conductivity (not shown). Herein the first conductive layer 31 electrically connects the second semiconductor layer, and the second conductive layer 33 electrically connects the first semiconductor layer. In the embodiment, a shape of the cushion part 37 in a top view can be a rectangular shape, the material of the cushion part 37 can be metal, and the cushion part 37 is electrically isolated from the first conductive layer 31 and the second conductive layer 33. In another embodiment, the material of the cushion part can be insulating material. In a top view, the cushion part 37 overlaps with the first conductive layer 31, and in a cross-sectional view, the cushion part 37 is substantially coplanar with and surrounded by the second conductive layer 33. The first pad 35 and the second pad 36 electrically connect the first semiconductor layer and the second semiconductor layer via the second conductive layer 33 and the first conductive layer 31, respectively. The cushion part 37 is located between the first pad 35 and the second pad 36 in a top view as shown in FIG. 3A and interposed between the first insulating layer 32 and the second insulating layer 34 in a cross-sectional view as shown in FIG. 3B.

Herein, the ejector pin 21' penetrates the blue tape 23' and then push the light-emitting element 3 to detach the light-emitting element 3 from the blue tape 23'. Because of the cushion part 37 integrated in the light-emitting element 3, while the ejector pin 21' detaches the light-emitting element 3 from the blue tape 23' via pushing the cushion part 37, cracks 27' can be produced nearby the cushion part 37 but not to form conductive paths between the first conductive layer 31 and the second conductive layer 33. Accordingly, in the first embodiment, the cushion part 37 and the first conductive layer 31 are electrically isolated from the second conductive layer 33. Short circuits in the light-emitting element 3 will not happen accordingly.

Figure 4A:
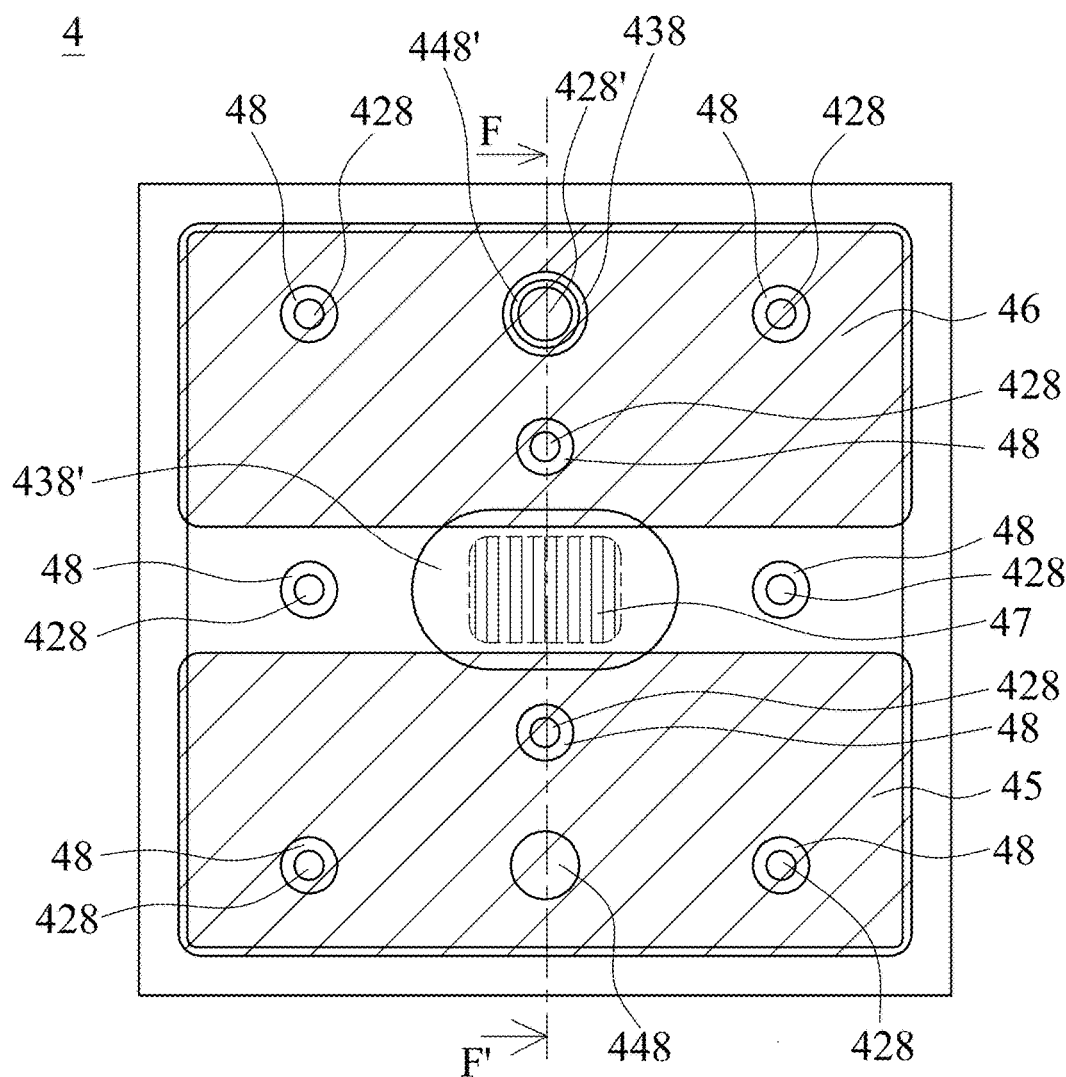
FIG. 4A shows a top view of a light-emitting element in accordance with a second embodiment of the application.
Figure 4B:
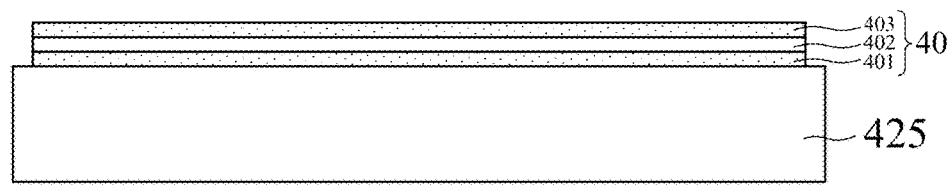
FIGS. 4B~4L show steps of a process flow of the light-emitting element along a line F-F' of FIG. 4A.

FIG. 4A shows a top view of a light-emitting element 4 in accordance with a second embodiment of the application. FIGS. 4B~4L show steps of a process flow of the light-emitting element 4 and cross-sectional views along a line F-F' of FIG. 4A. FIG. 4B shows a step of forming a semiconductor light-emitting stack 40 on a substrate 425. In this step, the substrate 425 is provided and the semiconductor light-emitting stack 40 is formed on the substrate 425. The substrate 425 includes a transparent substrate. A material of the substrate 425 includes transparent material which is transparent with respect to the light emitted from the semiconductor light-emitting stack 40, such as gallium arsenide (GaAs), gallium phosphide (GaP), gallium nitride (GaN), sapphire, diamond, glass, quartz, acrylic, zinc oxide (ZnO), or aluminum nitride (AlN). Additionally, the substrate 425 can be a conductive substrate or a non-conductive substrate based on the material of the substrate itself or the impurities doped in the substrate. The substrate 425 can be a substrate for epitaxial growth, optionally have a patterned upper surface which can improve epitaxy quality of the semiconductor light-emitting stack 40, and scatter the light emitted from the semiconductor light-emitting stack 40.

For improving the quality of the semiconductor light-emitting stack 40, a buffer layer (not shown) can be formed between the substrate 425 and the semiconductor light-emitting stack 40. The semiconductor light-emitting stack 40 includes a first semiconductor layer 401, a second semiconductor layer 403, and an active layer 402 formed between the first semiconductor layer 401 and the second semiconductor layer 403. Herein, the first semiconductor layer 401 and the second semiconductor layer 403 are with different conductivities, electricity, polarities, or dopants for providing electrons and holes. The polarity can be an n-type polarity or p-type polarity for supplying electrons and holes, respectively so that electrons and holes can combine in the active layer 402 to emit light. For example, the first semiconductor layer 401 can be an n-type semiconductor layer and the second semiconductor layer 403 can be a p-type semiconductor layer.

The material of the semiconductor light-emitting stack 40 includes aluminum gallium indium phosphide (AlGaInP) base or aluminum gallium indium nitride (AlGaInN) base. The active layer 402 includes single heterostructure (SH), double heterostructure (DH), double-side double heterostructure (DDH), or multi-quantum well (MQW) structure. Specifically, the active layer 402 includes i-type, p-type, or n-type semiconductor. The active layer 402 emits light when electrical current passes through the semiconductor light-emitting stack 40. When the active layer 402 includes AlGaInP based material, the active layer 402 emits amber series light, such as red light, orange light, or yellow light; when the active layer 402 includes AlGaInN based material, the active layer 402 emits blue, green or UV light. The present embodiment illustrates the semiconductor light-emitting stack 40 with aluminum gallium indium nitride (AlGaInN) based material.

Figure 4C:
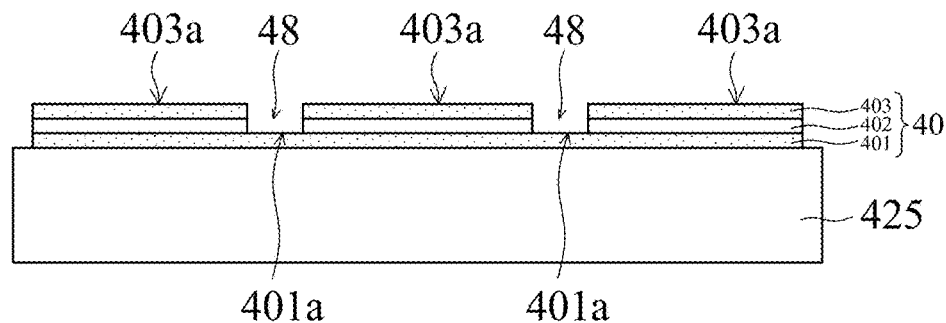

FIG. 4C shows a step of forming a plurality of first depressions 48. Referring to FIGS. 4A~4C, the plurality of first depressions 48 is formed in the semiconductor light-emitting stack 40 through optical lithography and etching processes. Each of the first depressions 48 penetrates from an upper surface 403a of the second semiconductor layer 403 into the second semiconductor layer 403, the active layer 402, and the first semiconductor layer 401 to expose an upper surface 401a of the first semiconductor layer 401. In the embodiment, the plurality of first depressions 48 is a plurality of vias.

Figure 4D:
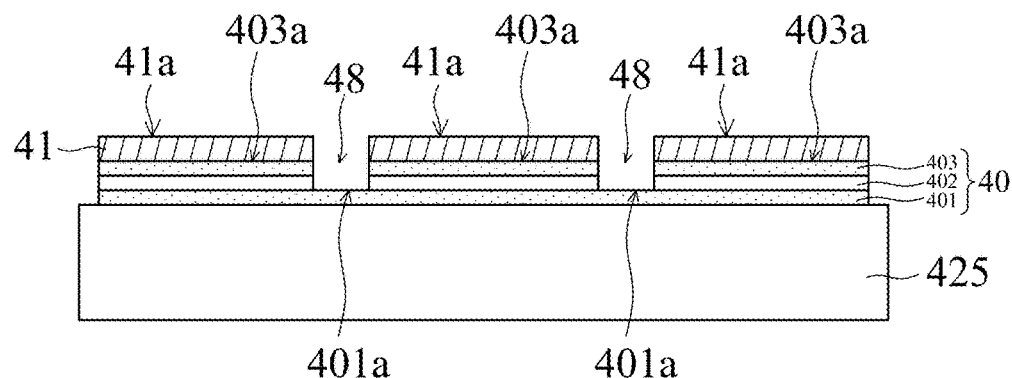

FIG. 4D shows a step of forming a first conductive layer 41 having an upper surface 41a. Firstly, the first conductive layer 41 is formed on the upper surfaces 401a and 403a and then a portion of the first conductive layer 41 is removed in accordance with the plurality of first depressions 48 through optical lithography and etching processes. Finally, the first conductive layer 41 is patterned and formed on the upper surface 403a of the second semiconductor layer 403. In another embodiment, the plurality of first depressions 48 can be formed after forming the first conductive layer 41 on the semiconductor light-emitting stack 40. The etching steps of the semiconductor light-emitting stack 40 and the first conductive layer 41 can be performed at the same time, that is etching parts of the semiconductor light-emitting stack 40 and the first conductive layer 41 at the same step and then the plurality of first depressions 48 is formed to expose the upper surface 401a. In the embodiment, the first conductive layer 41 electrically connects the second semiconductor layer 403. Additionally, the first conductive layer 41 has electrically contact with the second semiconductor layer 403 and can be metal material, such as, nickel (Ni), platinum (Pt), palladium (Pd), silver (Ag), or chromium (Cr), aluminum (Al), titanium (Ti), gold (Au), or combinations thereof. In one embodiment, the first conductive layer 41 can includes a plurality of layers, for example, a transparent conductive layer (not shown), a reflective layer (not shown) formed on the transparent conductive layer, and a barrier layer (not shown) formed on and covering the reflective layer to prevent migration or oxidization of the reflective layer causing a decrease in the reflectivity. The transparent conductive layer electrically connects the second semiconductor layer 403, and the reflective layer electrically connects the transparent conductive layer. Light emitting from the active layer 402 can be reflected to the substrate 425 by the reflective layer, and extracted from a surface of the substrate 425 opposite to the active layer 402. The material of the transparent conductive layer includes ITO (tin-doped indium oxide), AZO (aluminum-doped ZnO), GZO (gallium-doped zinc oxide), or IZO (indium-doped zinc oxide), and so forth; the material of the reflective layer includes silver, gold, copper, or aluminum, and so forth; the material of the barrier layer includes metal materials, for example, titanium (Ti), tungsten (W), aluminum (Al), indium (In), stannum (Sn), nickel (Ni), platinum (Pt), or an alloy including at least one metal selected from the group consisting of Ti, W, Al, In, Sn, Ni, and Pt as described above. Additionally, the barrier layer may include a metal stack such as Ti/Al/Ti/W disposed on the reflective layer.

Figure 4E:
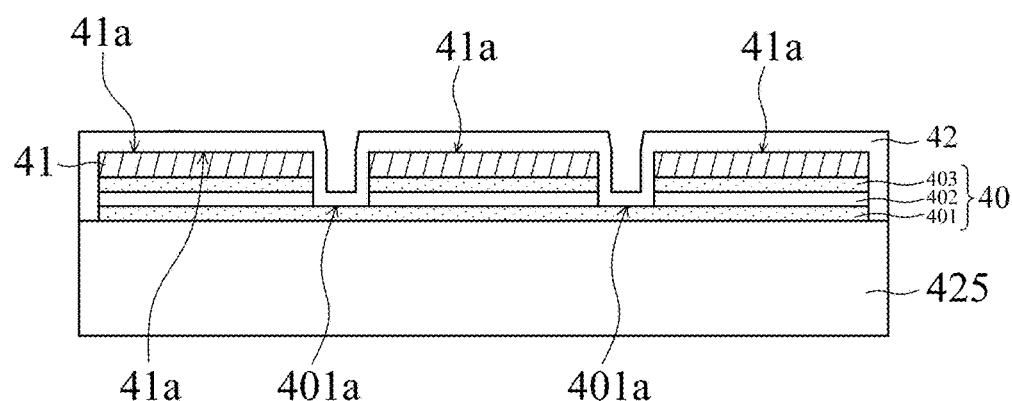

FIG. 4E shows a step of forming a first insulating layer 42. Referring to FIG. 4E, the first insulating layer 42 is formed on an upper surface 41a of the first conductive layer 41, side walls of the semiconductor light-emitting stack 40, the first conductive layer 41 and the first depressions 48, and the upper surface 401a of the first semiconductor layer 401 in the first depressions 48. The material of the first insulating layer 42 includes transparent material, for example, $SiO_2$, TiO$_2$, or Si$_3$N$_4$. Moreover, the first insulating layer 42 can be formed by evaporating, sputtering, or spin-on glass (SOG) coating.

Figure 4F:
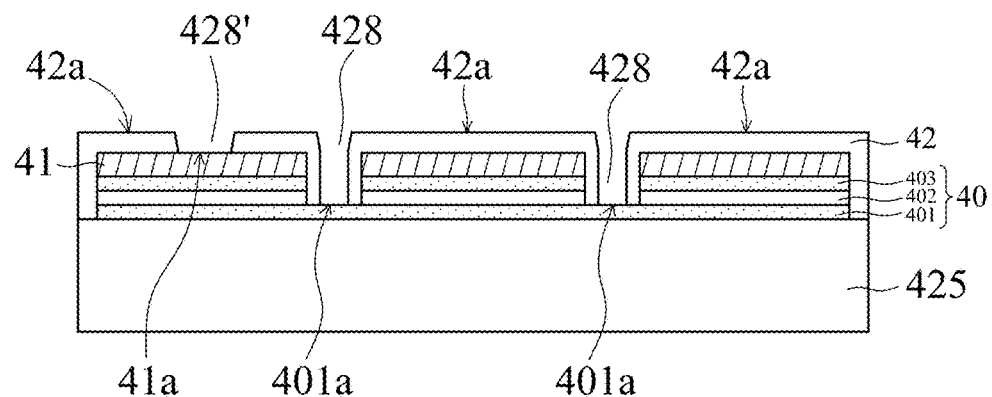

FIG. 4F shows a step of removing portions of the first insulating layer 42 to form second depressions 428 and 428'. After forming the first insulating layer 42, portions of the first insulating layer 42 on the upper surface 401*a* of the first semiconductor layer 401 and the upper surface 41*a* of the first conductive layer 41 are removed through optical lithography and etching processes to form the second depressions 428 and 428', respectively. The second depressions 428 penetrate from an upper surface 42*a* of the first insulating layer 42 into the first insulating layer 42 and expose the upper surface 401*a* of the first semiconductor layer 401. The second depression 428' penetrates from an upper surface 42*a* of the first insulating layer 42 into the first insulating layer 42 and exposes the upper surface 41*a* of the first conductive layer 41. In the embodiment, the second depressions 428 and 428' are vias.

Figure 4G:
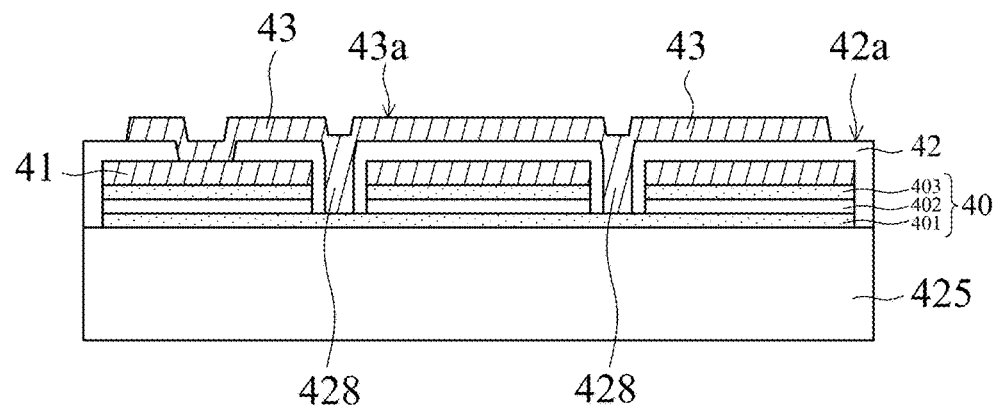
Figure 4H:
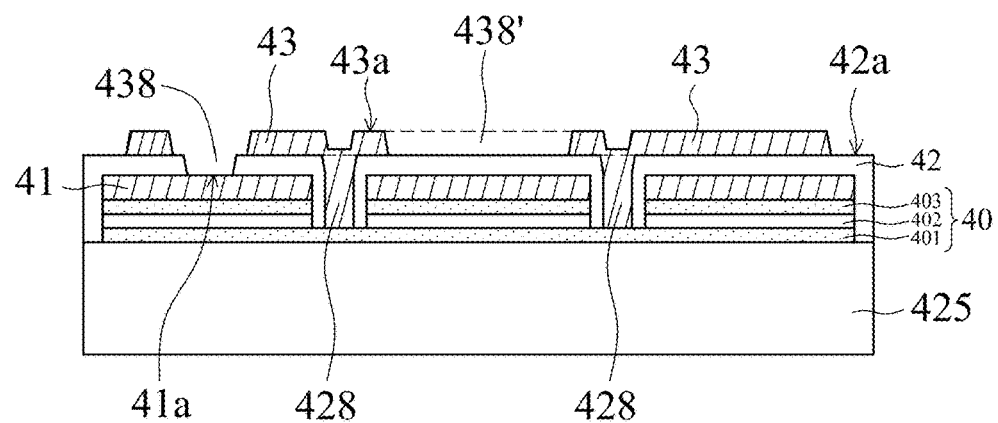

FIGS. 4G and 4H show steps of forming a second conductive layer 43 and third depressions 438 and 438'. Firstly, the second conductive layer 43, having an upper surface 43*a*, is formed to fill the second depressions 428 and 428' and covers a portion of the upper surface 42*a* of the first insulating layer 42. Herein, the second conductive layer 43 filling in the second depressions 428 electrically connects the first semiconductor layer 401. Then, a portion of the second conductive layer 43 located at a center region of the light-emitting element 4 is removed through optical lithography and etching processes to form the third depressions 438'. Herein, the third depression 438' penetrates from the upper surface 43*a* of second conductive layer 43 to the upper surface 42*a*. Moreover, a portion of the second conductive layer 43 filling in the second depression 428' is also removed through the same optical lithography and etching processes to form the third depressions 438 so that the upper surface 41*a* of the first conductive layer 41 and the upper surface 42*a* of the first insulating layer 42 are exposed. In the embodiment, the third depression 438 connects and is aligned with the second depression 428', and has a shape corresponding to the aligned second depression 428' in a top view. The third depression 438' is overlapped with the center region of the light-emitting element 4 in a top view. The material of the second conductive layer 43 can be metal material, such as, nickel (Ni), platinum (Pt), palladium (Pd), silver (Ag), chromium (Cr), aluminum (Al), titanium (Ti), gold (Au), or combinations thereof.

Figure 4I:
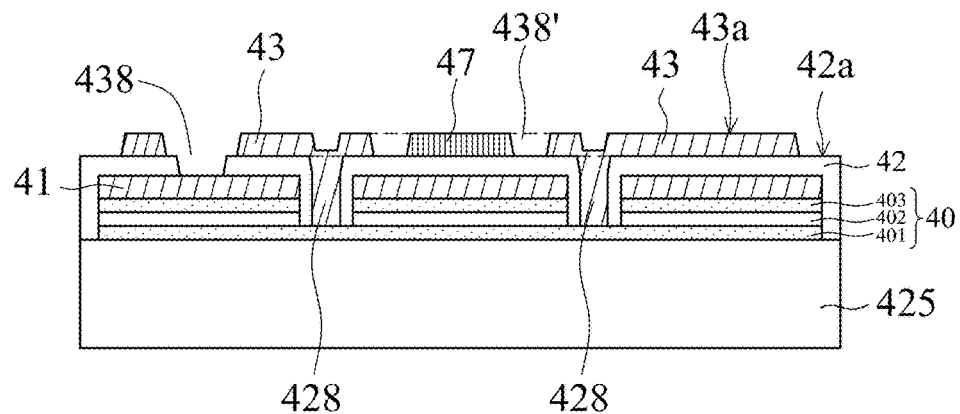

FIG. 4I shows a step of forming a cushion part 47. Referring to FIGS. 4A and 4H, the cushion part 47 is formed on the upper surface 42*a* of the first insulating layer 42 which is exposed by the third depressions 438' and located at the center region of the light-emitting element 4. Further, the cushion part 47 can be surrounded by the second conductive layer 43 and be electrically and physically isolated from the first conductive layer 41 and the second conductive layer 43. In the embodiment, a shape of the cushion part 47 in a top view can be a rectangular shape. A shape of the third depressions 438' in a top view can be a rectangular shape or an elliptical shape. The material of the cushion part 47 can be metal and the same as a material of the second conductive layer 43, such as, nickel (Ni), platinum (Pt), palladium (Pd), silver (Ag), chromium (Cr), aluminum (Al), titanium (Ti), gold (Au), or combinations thereof. In another embodiment, the material of the cushion part 47 can be insulating material or transparent material, for example, SiO$_2$, TiO$_2$, or Si$_3$N$_4$, and the cushion part 47 can be formed by evaporating, sputtering, or spin-on glass (SOG) coating. The thickness of the cushion part 47 can be designed to bear the detaching strength of the ejector pin to prevent damages of the light-emitting stack during the ejector pin detaching process. In detail, the cushion part 47 with the designed thickness can prevent short circuits between the first conductive layer 41 and the second conductive layer 43 in the light-emitting element 4 due to the cracks of the first insulating layer 42 occurring in the ejector pin detaching process.

Figure 4J:
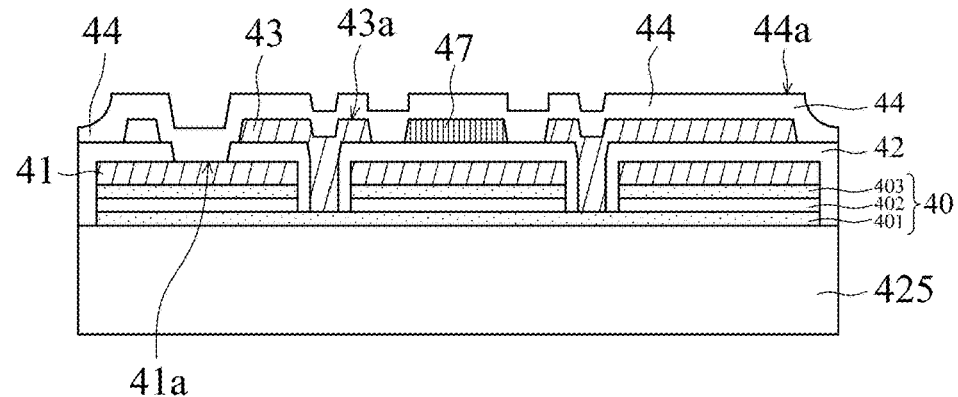

FIG. 4J shows a step of forming a second insulating layer 44. Referring to FIG. 4J, the second insulating layer 44 is formed on the upper surface 43*a*, side walls of the second conductive layer 43, and the upper surface 41*a* of the first conductive layer 41. In detail, the second insulating layer 44 covers the cushion part 47, and fills into the third depressions 438 and 438'. In one embodiment, the second insulating layer 44 can fill up at least one of the third depressions 438 and 438'.

Figure 4K:
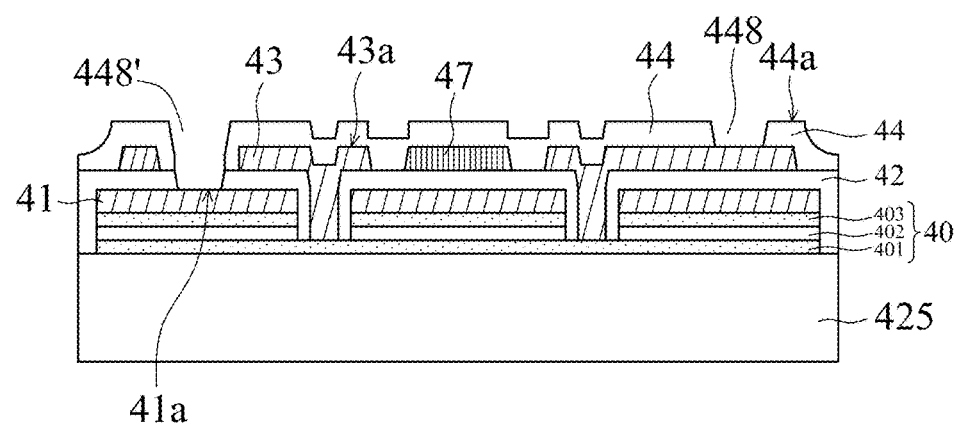

FIG. 4K shows a step of removing portions of the second insulating layer 44 to form a plurality of fourth depressions 448 and 448'. After forming the second insulating layer 44, a portion of the second insulating layer 44, on the upper surface 43*a* of the second conductive layer 43, is removed through optical lithography and etching processes to form the fourth depression 448 and expose the upper surface 43*a* of the second conductive layer 43. In addition, the second insulating layer 44 filling in the third depression 438 is also removed to expose the upper surface 41*a* of the first conductive layer 41 through the same optical lithography and etching processes and then the fourth depression 448' is formed accordingly. Herein, the fourth depression 448 penetrates from an upper surface 44*a* of the second insulating layer 44 to expose the upper surface 43*a* of the second conductive layer 43 and the fourth depression 448' expose the second depression 428' so as to expose the upper surface 41*a* of the first conductive layer 41. As shown in FIG. 4K, the cushion part 47 is interposed between and encapsulated by the first insulating layer 42 and the second insulating layer 44 in a cross-sectional view.

Figure 4L:
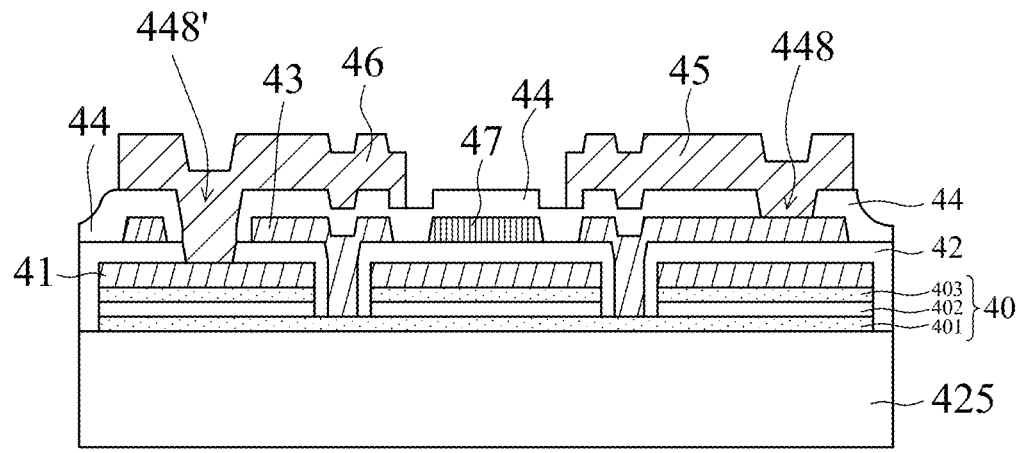

FIG. 4L shows a step of forming a first pad 45 and a second pad 46. The first pad 45 and the second pad 46 are formed on the second insulating layer 44. Herein, the first pad 45 is formed on one side of the substrate 425 in a top view and fills in the fourth depression 448 for contacting the second conductive layer 43 so as to electrically connect the first semiconductor layer 401. The second pad 46 is formed on another side of the substrate 425 in a top view and fills in the fourth depression 448' for contacting the first conductive layer 41 so as to electrically connect the second semiconductor layer 403. When the light-emitting element 4 electrically connects a power supply (not shown) via the first pad 45 and the second pad 46, the active layer 402 emits light. As shown in the FIGS. 4A and 4L, the cushion part 47 is disposed between the first pad 45 and the second pad 46. As the reason mentioned above, when an ejector pin (not shown) pushes the light-emitting element 4, short circuits will not happen due to the protection of the cushion part 47.

Figure 5:
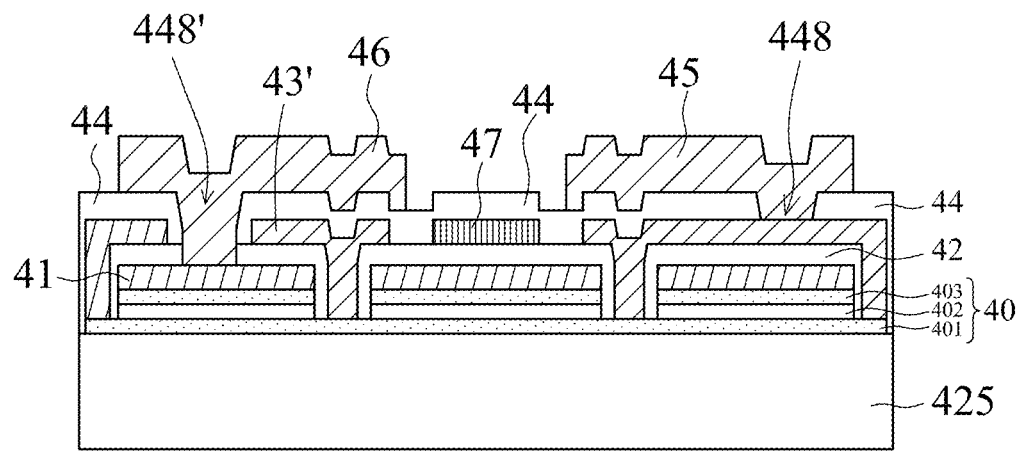
FIG. 5 shows a cross-sectional view of a light-emitting element in accordance with a third embodiment of the application.

Referring to FIG. 5, it shows a cross-sectional view of a light-emitting element 5 in accordance with a third embodiment of the application. The structure of light-emitting element 5 is similar to that of the light-emitting element 4. For clarifying, in the third embodiment, similar components are labeled by the same reference numbers and the descriptions thereof are omitted herein. The differences between the light-emitting element 5 and the light-emitting element 4 are, in the third embodiment, a second conductive layer 43' covers side walls/surfaces of a first insulating layer 42, outer edges of the second conductive layer 43' excess over outer edges of an active layer 402 and a second semiconductor layer 403 of a semiconductor light-emitting stack 40 in a cross-sectional view as shown in FIG. 5, and the outer edges of the second conductive layer 43' physically contacts a first semiconductor layer 401 of the semiconductor light-emitting stack 40 to form a periphery contacting area. Accordingly, a contact area between the second conductive layer 43' and the first semiconductor layer 401 of the third embodiment is greater than that of the second embodiment. The electrical characteristic of the light-emitting element 5, such as forward voltage, can be better than that of light-emitting element 4. Similarly, when the light-emitting element 5 electrically connects a power supply via a first pad 45 and a second pad 46, the active layer 402 emits light.

Figure 6A:
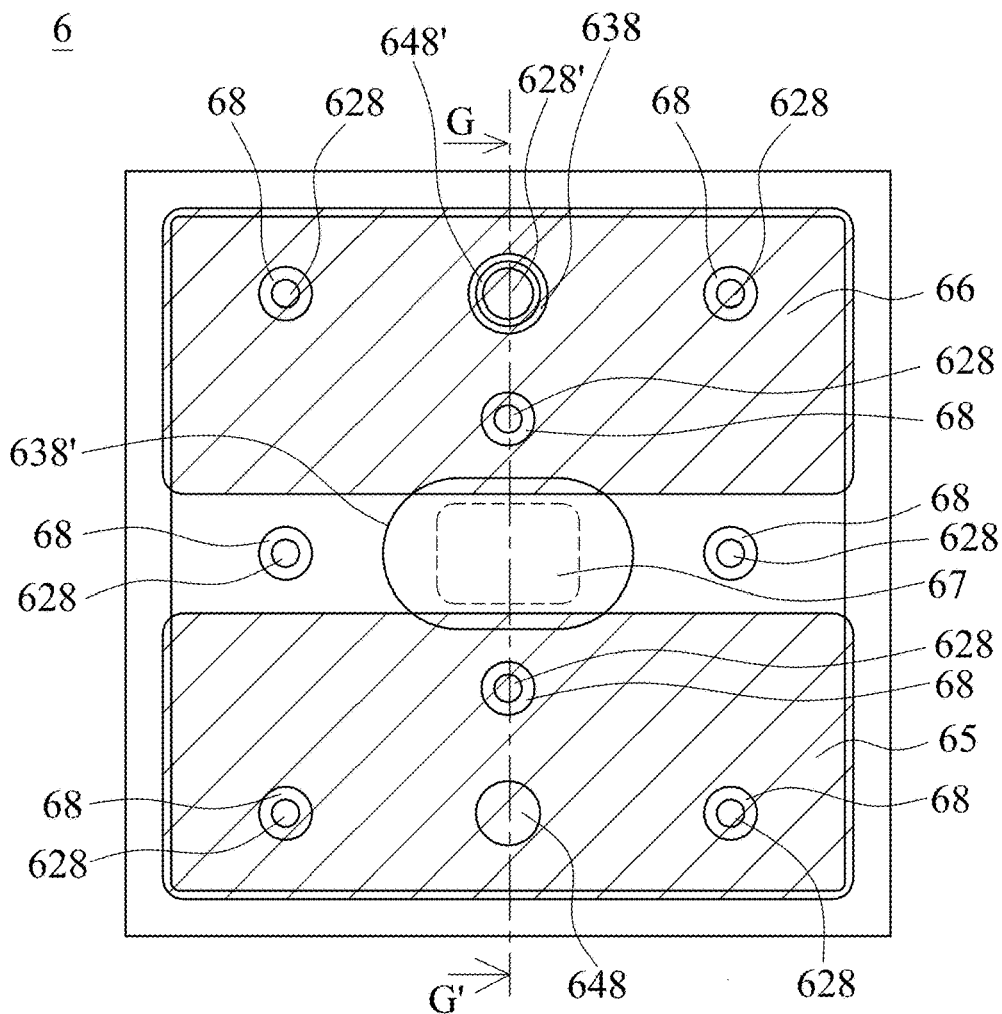
FIG. 6A shows a top view of a light-emitting element in accordance with a fourth embodiment of the application.
Figure 6B:
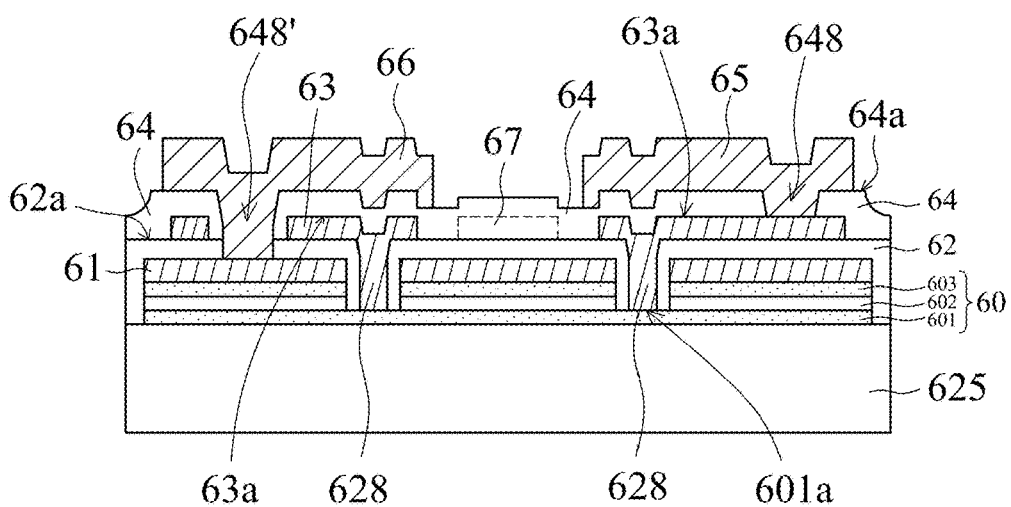
FIG. 6B shows a cross-sectional view of the light-emitting element alone a line G-G' of FIG. 6A.

Referring to FIGS. 6A~6B, FIG. 6A shows a top view of a light-emitting element 6 in accordance with a fourth embodiment of the application and FIG. 6B shows a cross-sectional view of the light-emitting element 6 along a line G-G' of FIG. 6A. As shown in FIGS. 6A~6B, the light-emitting element 6 includes a semiconductor light-emitting stack 60 on a substrate 625, a first conductive layer 61 on the semiconductor light-emitting stack 60, a first insulating layer 62 on the first conductive layer 61, a second conductive layer 63 on the first insulating layer 62, a second insulating layer 64 on the second conductive layer 63, a first pad 65, a second pad 66, a cushion part 67 between the first pad 65 and the second pad 66 in a top view, a plurality of first depressions 68, second depressions 628 and 628', third depressions 638 and 638', and fourth depressions 648 and 648'. When the light-emitting element 6 electrically connects a power supply via the first pad 65 and the second pad 66, the active layer 602 emits light.

The structure of the fourth embodiment is similar to that of the second embodiment. The difference between the fourth embodiment and the second embodiment is that the material of the cushion part 67 is insulating material and can be the same as the material of the first insulating layer 62 or the second insulating layer 64. In the embodiment, the cushion part 67 is formed in a center region of the light-emitting element 6 in a top view and interposed between the first insulating layer 62 and the second insulating layer 64 to prevent the crack damage. When an ejector pin (not shown) pushes the center region of the light-emitting element 6, the cushion part 67 can absorb part of the strength from the ejector pin to prevent from conductive paths occurring between the first conductive layer 61 and the second conductive layer 63, and short circuits due to the conductive paths will not happen accordingly.

Figure 7A:
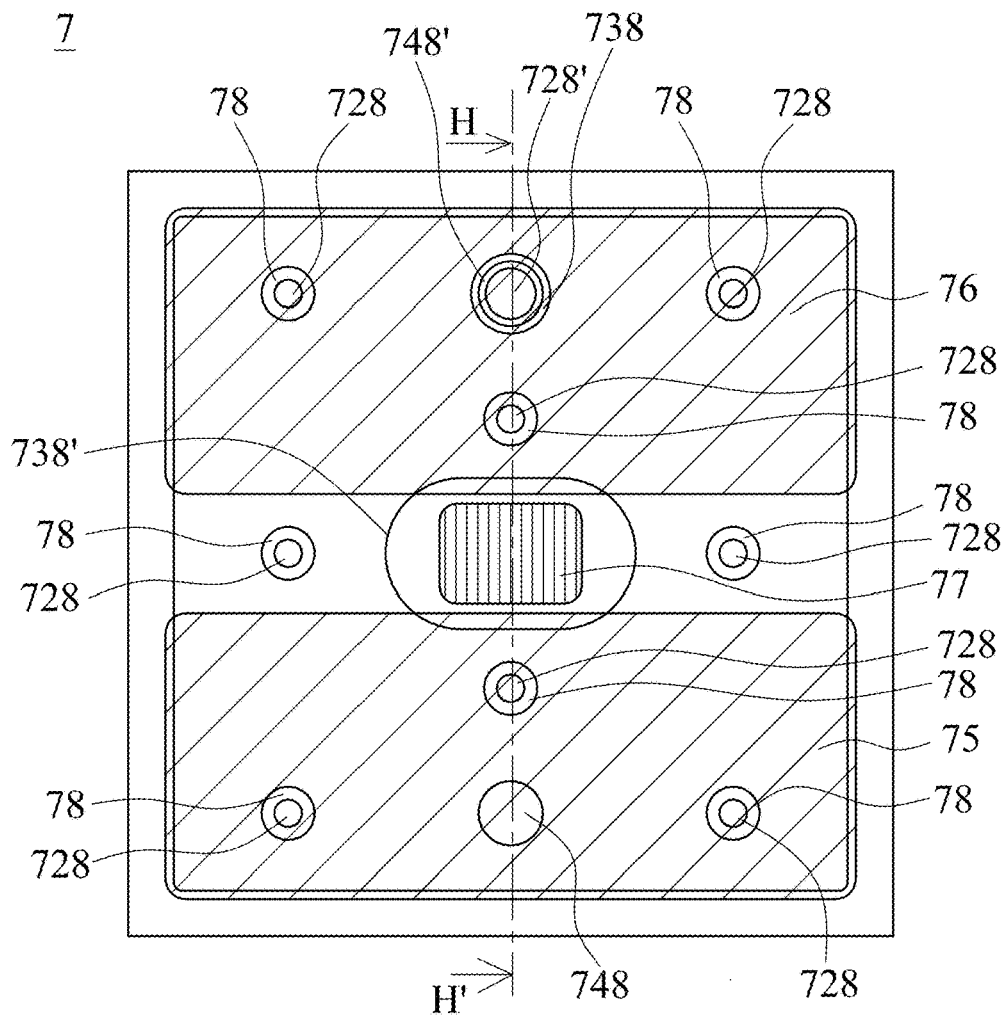
FIG. 7A shows a top view of a light-emitting element in accordance with a fifth embodiment of the application.
Figure 7B:
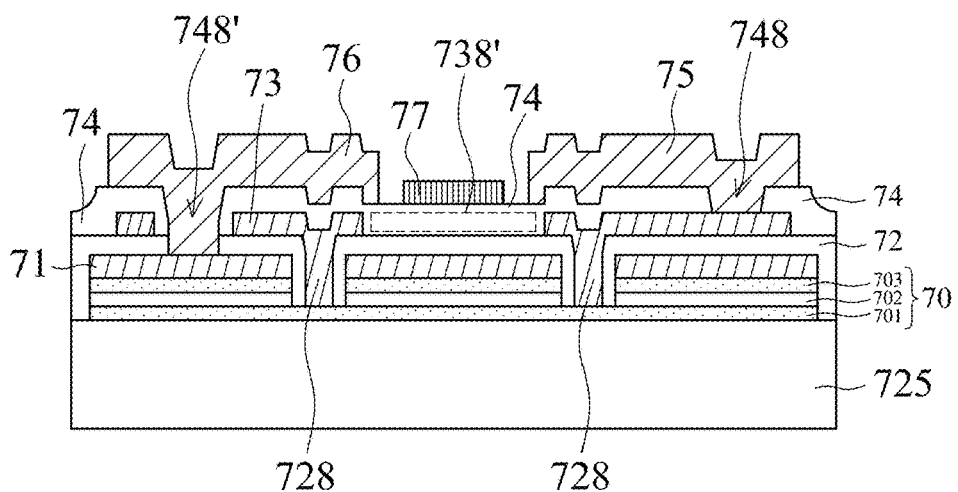
FIG. 7B shows a cross-sectional view of the light-emitting element alone a line H-H' of FIG. 7A.

Referring to FIGS. 7A~7B, FIG. 7A shows a top view of a light-emitting element 7 in accordance with a fifth embodiment of the application, and FIG. 7B shows a cross-sectional view of the light-emitting element 7 along a line H-H' of FIG. 7A. The light-emitting element 7 includes a semiconductor light-emitting stack 70, having a first semiconductor layer 701 with a first conductivity, an active layer 702, and a second semiconductor layer 703 with a second conductivity, on a substrate 725, a first conductive layer 71 on the semiconductor light-emitting stack 70, a first insulating layer 72 on the first conductive layer 71, a second conductive layer 73 on the first insulating layer 72, a second insulating layer 74 on the second conductive layer 73, a first pad 75, a second pad 76, a cushion part 77 between the first pad 75 and the second pad 76, a plurality of first depressions 78, second depressions 728 and 728', third depressions 738 and 738', and fourth depressions 748 and 748'. When the light-emitting element 7 electrically connects a power supply via the first pad 75 and the second pad 76, the active layer 702 emits light.

The structure of the fifth embodiment is similar to that of the second embodiment. Similar components are labeled with similar reference numeral and descriptions therewith are omitted herein. Similarly, a shape of the cushion part 77 in a top view includes a rectangular shape. However, the difference between the fifth embodiment and the second embodiment is the location of the cushion part 77. In the embodiment, in order to prevent the crack damage, the cushion part 77 is formed on the second insulating layer 74. In detail, the second insulating layer 74 are formed on the first insulating layer 72, and fills into the third depression 738', overlapped with the center region of the light-emitting element 7. When an ejector pin (not shown) pushes the center region of the light-emitting element 7, the cushion part 77 can absorb part of the strength from the ejector pin to prevent from conductive paths occurring between the first conductive layer 71 and the second conductive layer 73, and short circuits due to the conductive paths will not happen accordingly.

Figure 8A:
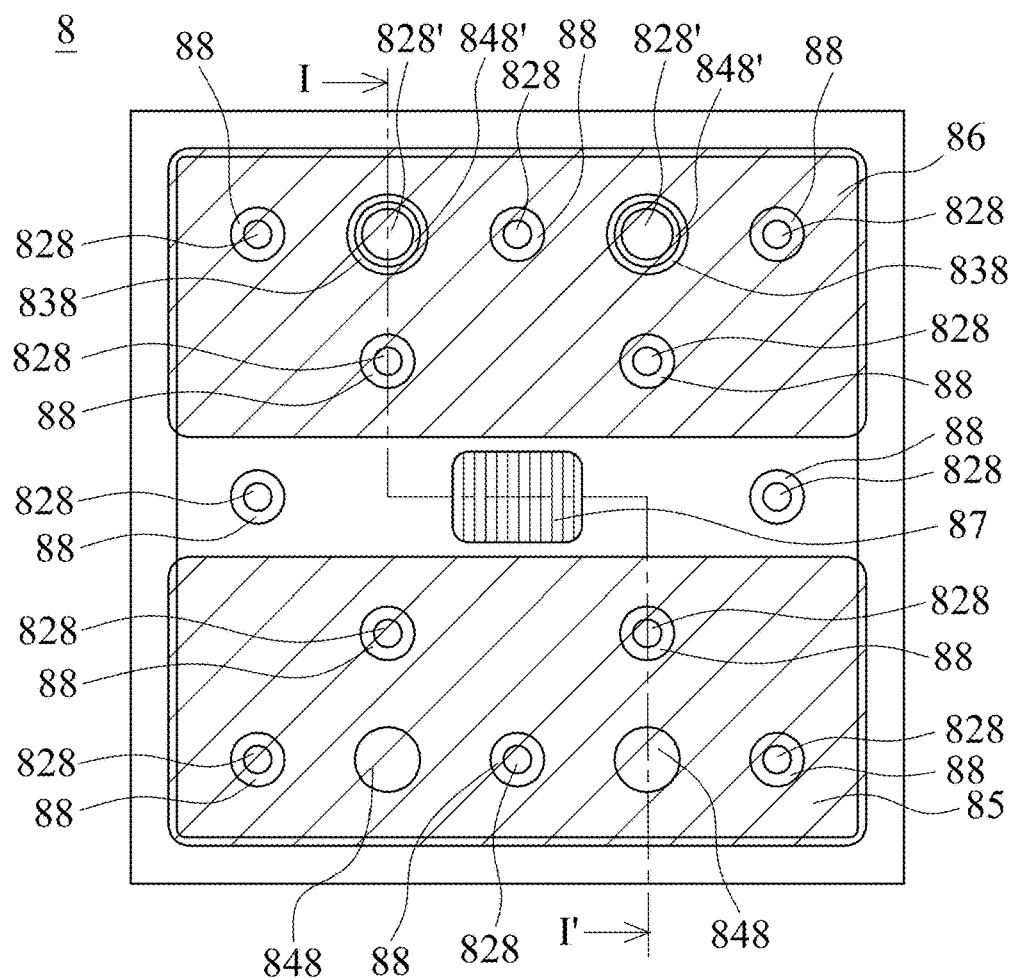
FIG. 8A shows a top view of a light-emitting element in accordance with a sixth embodiment of the application.
Figure 8B:
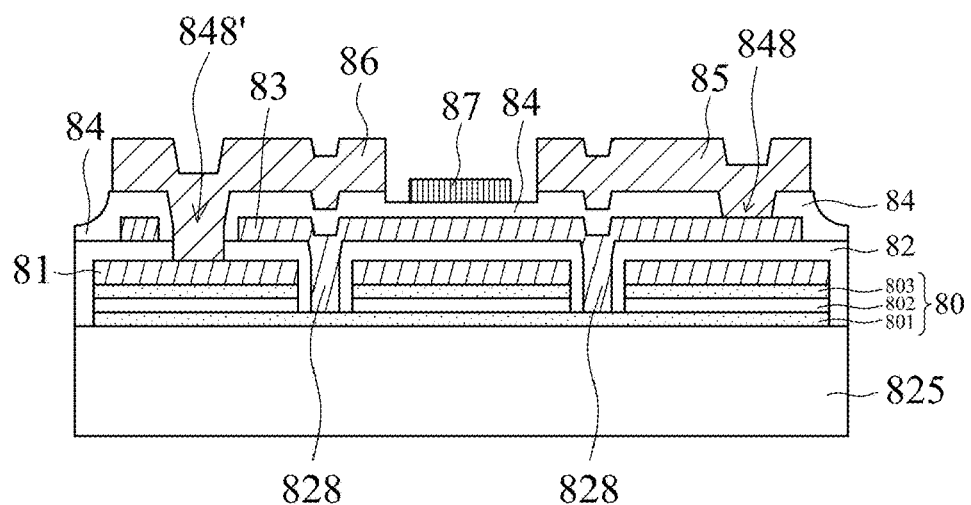
FIG. 8B shows a cross-sectional view of the light-emitting element alone a line I-I' of FIG. 8A.

Referring to FIGS. 8A~8B, FIG. 8A shows a top view of a light-emitting element 8 in accordance with a sixth embodiment of the application and FIG. 8B shows a cross-sectional view of the light-emitting element 8 along a line I-I' of FIG. 8A. As shown in FIGS. 8A~8B, the light-emitting element 8 includes a semiconductor light-emitting stack 80, having a first semiconductor layer 801 with a first conductivity, an active layer 802, and a second semiconductor layer 803 with a second conductivity, on a substrate 825, a first conductive layer 81 on the semiconductor light-emitting stack 80, a first insulating layer 82 on the first conductive layer 81, a second conductive layer 83 on the first insulating layer 82, a second insulating layer 84 on the second conductive layer 83, a first pad 85, a second pad 86, a cushion part 87 between the first pad 85 and the second pad 86 in a top view, and a plurality of first depressions 88, second depressions 828 and 828', third depressions 838, and fourth depressions 848 and 848'. When the light-emitting element 8 electrically connects a power supply via the first pad 85 and the second pad 86, the active layer 802 emits light.

The structure of the sixth embodiment is similar to that of the second embodiment. Similar components are labeled with similar reference numeral and descriptions therewith are omitted herein. Similarly, a shape of the cushion part 87 in a top view includes a rectangular shape. However, the difference between the sixth embodiment and the second embodiment is the relative positions among the cushion part, the second insulating layer, and the second conductive layer, and the relative process. Referring to the light-emitting element 4 of the second embodiment, the cushion part 47 is formed in the third depression 438', overlapped with a center region of the light-emitting element 4 in a top view, and the cushion part 47 is disposed between the second insulating layer 44 and the second conductive layer 43. Referring to the light-emitting element 8 of the embodiment, the second conductive layer 83, the second insulating layer 84, and the cushion part 87 are formed in a center region of the light-emitting element 8 in sequence. In detail, there is no third depression formed in the second conductive layer 83 to expose an upper surface of the first insulating layer 82, the second insulating layer 84 is located right above the second conductive layer 83. The cushion part 87 is directly formed on the second insulating layer 84 in a cross-sectional view. Moreover, as shown in FIG. 8B, the second conductive layer 83 is continuously overlapped with the center region. Additionally, when an ejector pin (not shown) pushes the center region of the light-emitting element 8, the cushion part 87 can absorb part of the strength from the ejector pin to prevent from conductive paths occurring between the first conductive layer 81 and the second conductive layer 83, and short circuits due to the conductive paths will not happen accordingly.

Figure 9A:
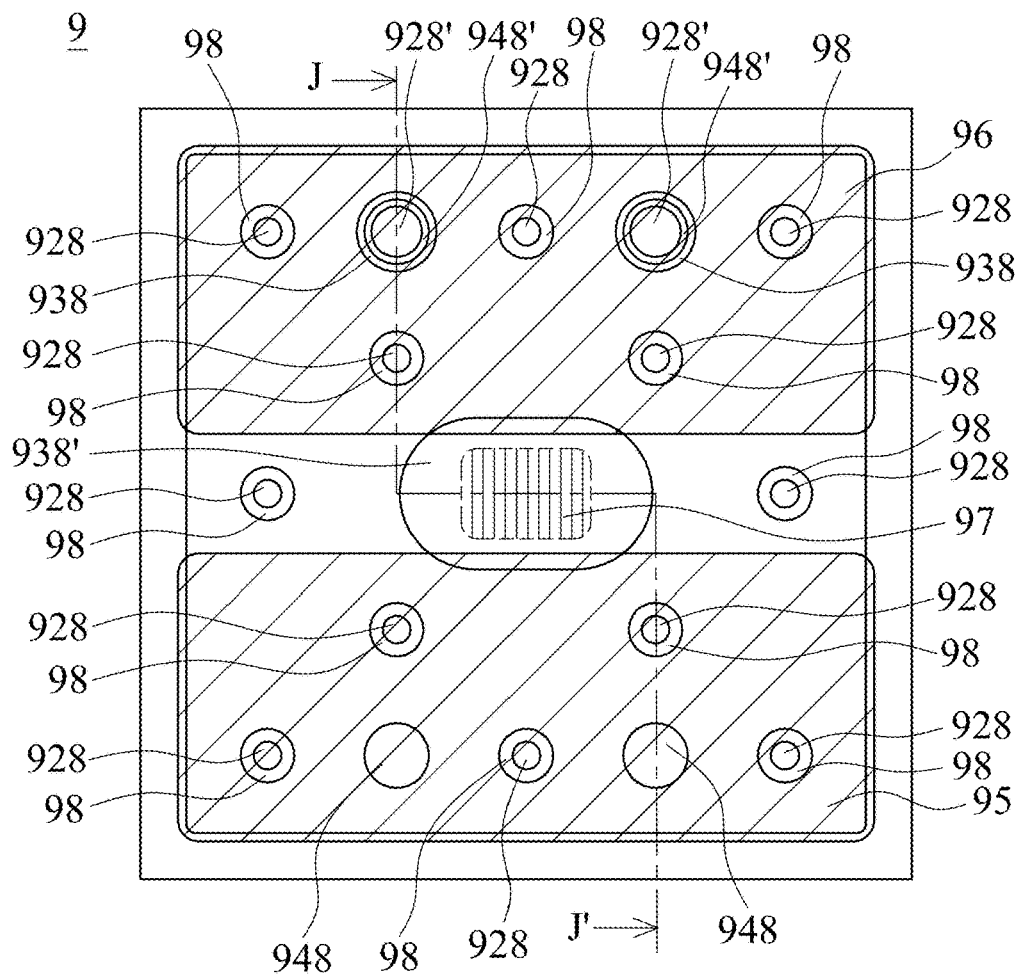
FIG. 9A shows a top view of a light-emitting element in accordance with a seventh embodiment of the application.
Figure 9B:
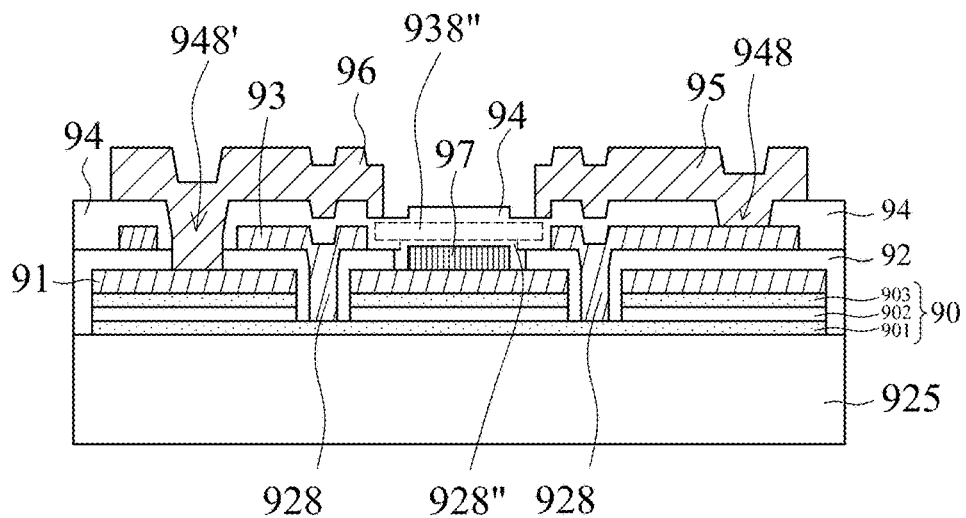
FIG. 9B shows a cross-sectional view of the light-emitting element alone a line J-J' of FIG. 9A.

Referring to FIGS. 9A~9B, FIG. 9A shows a top view of a light-emitting element 9 in accordance with a seventh embodiment of the application and FIG. 9B shows a cross-sectional view of the light-emitting element 9 along a line J-J' of FIG. 9A. As shown in FIGS. 9A~9B, the light-emitting element 9 includes a semiconductor light-emitting stack 90, having a first semiconductor layer 901 with a first conductivity, an active layer 902, and a second semiconductor layer 903 with a second conductivity, on a substrate 925, a first conductive layer 91 on the semiconductor light-emitting stack 90, a first insulating layer 92 on the first conductive layer 91, a cushion part 97 on the first conductive layer 91 and interposed in the first insulating layer 92 in a cross-sectional view, a second conductive layer 93 on the first insulating layer 92, a second insulating layer 94 on the second conductive layer 93, a first pad 95, a second pad 96, and a plurality of first depressions 98, second depressions 928 928', and 928", third depressions 938 and 938', and fourth depressions 948 and 948'. Herein, a shape of the cushion part 97 in a top view includes a rectangular shape.

The structure of the embodiment is similar to that of the second embodiment. Similar components are labeled with similar reference numeral and descriptions therewith are omitted herein. In the embodiment, steps and sequences of forming the semiconductor light-emitting stack 90 are similar to that of the second embodiment, and descriptions therewith are omitted herein. The differences between the embodiment and the second embodiment are the positions of second depressions, the cushion part, and the third depressions, and the relative forming steps. Referring to the light-emitting element 9 of the embodiment, in the step of forming the second depressions 928, 928', and 928", it further includes removing the first insulating layer 92 overlapped with a center region of the light-emitting element 9 to form the second depression 928". Then, the cushion part 97 is formed in the second depression 928" and contacts the first conductive layer 91. Afterwards, the second conductive layer 93 and the third depressions 938 and 938' in the second conductive layer 93 are formed, and then the second insulating layer 94 fills the second depression 928" and the third depression 938' to cover the cushion part 97.

The material of the cushion part 97 can be the same as a material of the first conductive layer 91 or the second conductive layer 93, such as, nickel (Ni), platinum (Pt), palladium (Pd), silver (Ag), chromium (Cr), aluminum (Al), titanium (Ti), gold (Au), or combinations thereof. In another embodiment, the material of the cushion part 97 can be insulating material or transparent material, such as $SiO_2$, $TiO_2$, or $Si_3N_4$, and the cushion part 97 can be formed by evaporating, sputtering, or spin-on glass (SOG) coating. In the embodiment, when an ejector pin (not shown) pushes the center region of the light-emitting element 9, the cushion part 97 can absorb part of the strength from the ejector pin to prevent from conductive paths occurring between the first conductive layer 91 and the second conductive layer 93, and short circuits due to the conductive paths will not happen accordingly.

Figure 10A:
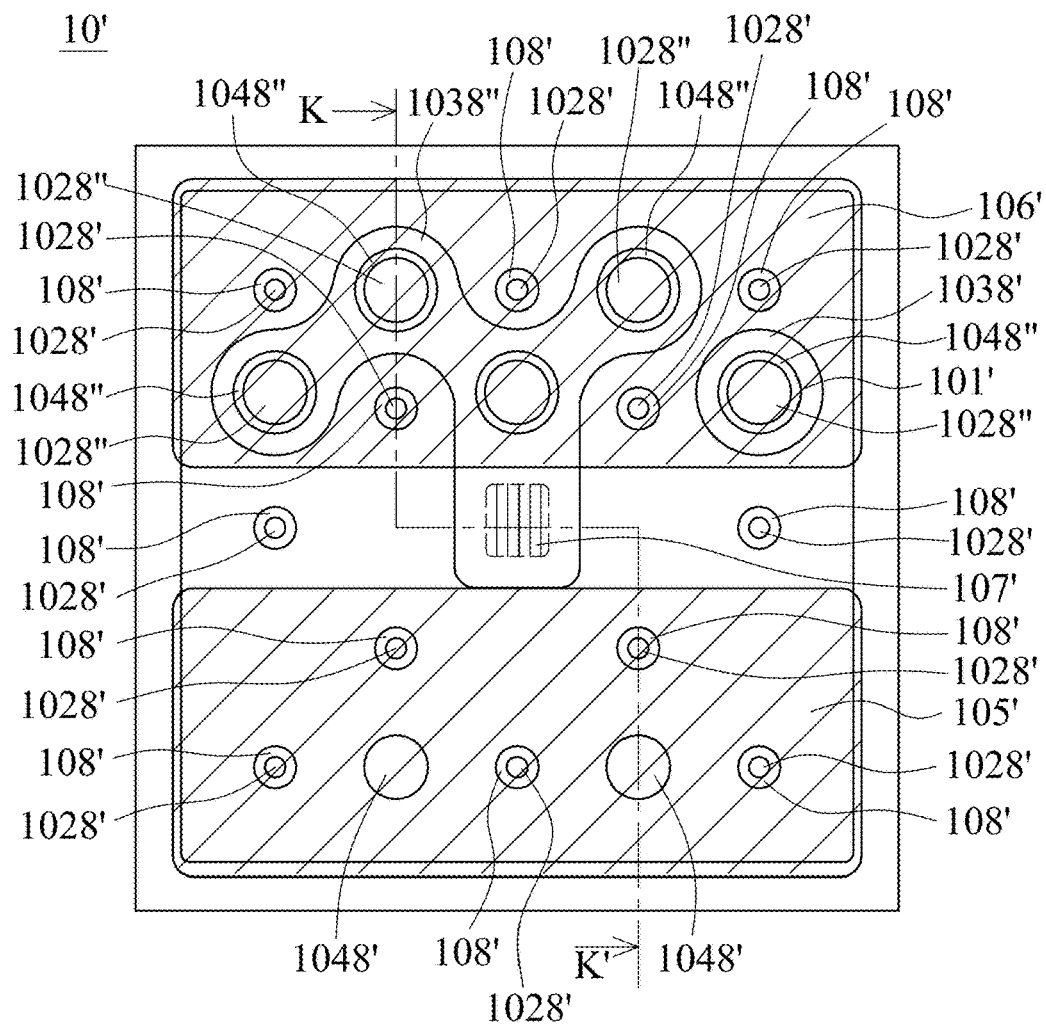
FIG. 10A shows a top view of a light-emitting element in accordance with an eighth embodiment of the application.
Figure 10B:
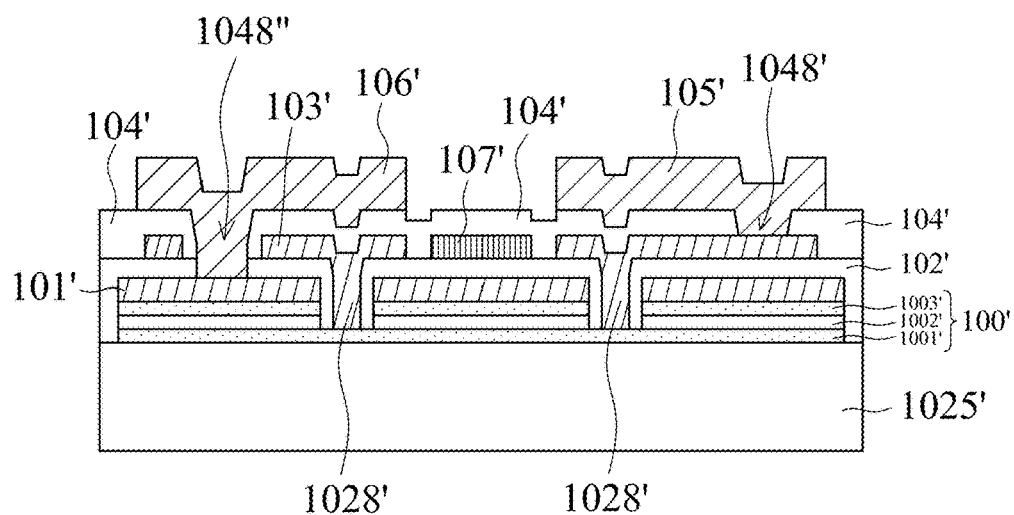
FIG. 10B shows a cross-sectional view of the light-emitting element alone a line K-K' of FIG. 10A.

Referring to FIGS. 10A~10B, FIG. 10A shows a top view of a light-emitting element 10' in accordance with an eighth embodiment of the application and FIG. 10B shows a cross-sectional view of the semiconductor light-emitting element 10' along a line K-K' of FIG. 10A. As shown in FIGS. 10A~10B, the light-emitting element 10' includes a semiconductor light-emitting stack 100', having first semiconductor layer 1001' with a first conductivity, an active layer 1002', and a second semiconductor layer 1003' with a second conductivity, on the substrate 1025', a first conductive layer 101' on the semiconductor light-emitting stack 100', a first insulating layer 102' on the first conductive layer 101', a second conductive layer 103' on the first insulating layer 102', a second insulating layer 104' on the second conductive layer 103', a first pad 105', a second pad 106', a cushion part 107' between the first insulating layer 102' and the second insulating layer 104', and a plurality of first depressions 108', second depressions 1028' and 1028", third depressions 1038' and 1038", and fourth depressions 1048' and 1048". When the light-emitting element 10' electrically connects a power supply via the first pad 105' and the second pad 106', the active layer 1002' emits light.

The structure of the eighth embodiment is similar to that of the second embodiment. Similar components are labeled with similar reference numeral and descriptions therewith are omitted herein. However, the difference between the eighth embodiment and the second embodiment is structures of the third depressions and steps of forming the third depressions. Referring to the light-emitting element 4 of the second embodiment, the shapes of the third depressions 438 and 438' are a circle and an ellipse, respectively. In the eighth embodiment, in the step of forming the third depression 1038", a portion of the second conductive layer 103' is removed and the shape of the removed portion of second conductive layer 103' is irregular. The shape of the third depressions 1038" corresponds to that of the removed portion of second conductive layer 103' with the irregular shape. The cushion part 107' with a rectangular shape is formed in the third depressions 1038", covered by the second insulating layer 104', disposed between the first insulating layer 102' and the second insulating layer 104', and located in a center region of the light-emitting element 10'. When an ejector pin (not shown) pushes the center region of the light-emitting element 10' for detaching the light-emitting element 10' from a blue tape, the cushion part 107' can absorb part of the strength from the ejector pin to prevent from conductive paths occurring between the first conductive layer 101' and the second conductive layer 103', and short circuits due to the conductive paths will not happen accordingly.

Figure 11A:
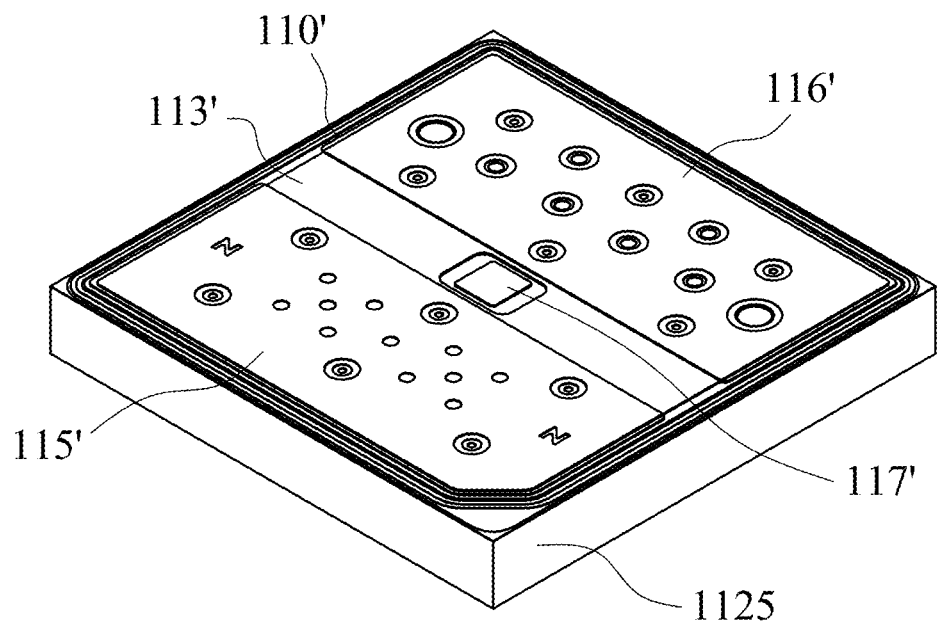
FIG. 11A shows an isometric view of a light-emitting element in accordance with a ninth embodiment of the application.
Figure 11B:
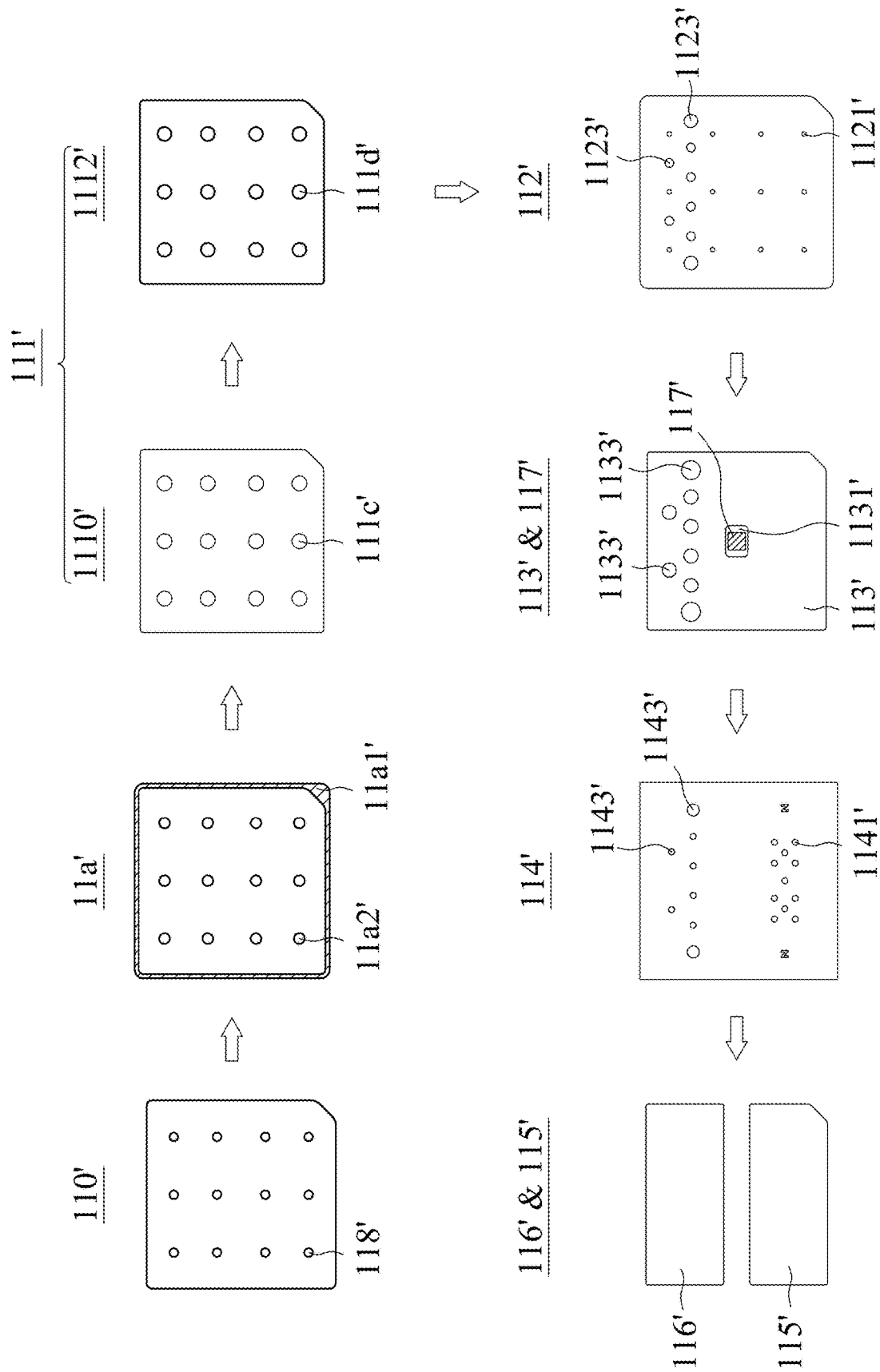
FIG. 11B shows a top view of each layer of FIG. 11A.

Referring to FIGS. 11A~11B, FIG. 11A shows an isometric view of a light-emitting element 11' in accordance with a ninth embodiment of the application, FIG. 11B shows a top view of each layer of the light-emitting element 11' in FIG. 11A. As shown in FIGS. 11A~11B, the light-emitting element 11' includes a semiconductor light-emitting stack 110', having a first semiconductor layer, an active layer and a second semiconductor layer (not shown in FIGS. 11A~11B), on a substrate 1125, a first conductive layer 111' on the semiconductor light-emitting stack 110', a first insulating layer 112' on the first conductive layer 111', a second conductive layer 113' and a cushion part 117' on the first insulating layer 112', a second insulating layer 114' on the second conductive layer 113', and a first pad 115' and a second pad 116' on the second insulating layer 114' respectively.

Steps of forming the light-emitting element 11' includes forming the semiconductor light-emitting stack 110' on the substrate 1125 and forming depressions 118' in the semiconductor light-emitting stack 110'. Herein, the semiconductor light-emitting stack 110' is epitaxially grown on the substrate 1125 and portions of the semiconductor light-emitting stack 110' are etched away to form the depressions 118'. In the embodiment, the depressions 118' penetrate into the second semiconductor layer and the active layer from an upper surface of the semiconductor light-emitting stack 110' to expose an upper surface of the first semiconductor layer. Each of these layers of the semiconductor light-emitting stack 110' may include a number of sub-layers that vary in composition with respect to one another. The active layer can be constructed from multiple InGaN layers separated by GaN layers. An upper surface of the second semiconductor layer can be roughened by a suitable etching process. When the light-emitting element 11' electrically connects a power supply via the first pad 115' and the second pad 116', the active layer emits light.

Referring to FIGS. 11A~11B, the steps of forming the light-emitting element 11' further include forming an insulating layer 11a' on the semiconductor light-emitting stack 110' before forming the first conductive layer 111'. Herein, the insulating layer 11a' includes a square ring-like region 11a1' in a top view located on the edges of the semiconductor light-emitting stack 110' and several circle ring-like regions 11a2' corresponding to the positions of the depressions 118'. The square ring-like region 11a1' covers the sidewall of the active layer and the second semiconductor layer. The circle ring-like regions 11a2' cover the sidewalls of the depressions 118' and expose portions of the upper surface of the first semiconductor layer in the depressions 118'. The step of exposing the upper surface of the first semiconductor layer in the depressions 118' can be achieved via the etching and lithography processes.

The first conductive layer 111' includes a first layer 1110' having depressions 111c' and a second layer 1112' having depressions 111d'. The first layer 1110' can be made of ITO, is formed on and covers a surface of the semiconductor light-emitting stack 110' and is devoid of filling in the depressions 118', and the second layer 1112' is formed on the first layer 1110' and is devoid of filling in the depressions 111c'. The second layer 1112' can be a mirror layer, for example, silver, and able to reflect light from the active layer. The first layer 1110' and the second layer 1112' can be deposited over the semiconductor light-emitting stack 110' and electrically connect the second semiconductor layer.

After forming the first layer 1110' and the second layer 1112', the first insulating layer 112' is formed on the second layer 1112'. Herein, the first insulating layer 112' is patterned as shown in FIG. 11B and includes a plurality of depressions 1121' and 1123'. In the step of forming the first insulating layer 112', the first insulating layer 112' is formed on the second layer 1112' and covers side surfaces of the circle ring-like regions 11a2', side surfaces of the depressions 111c' of the first layer 1110', and side surfaces of the depressions 111d' of the second layer 1112'. The first insulating layer 112' is devoid of covering the upper surface of the first semiconductor layer exposed by the circle ring-like regions 11a2' to form the depressions 1121'. The step of forming the depressions 1121' and 1123' can be achieved by the etching and lithography processes. In another embodiment, the circle ring like region 11a2' and the depressions 1121' of the first insulating layer 112' exposing the upper surface of the first semiconductor layer in the depressions 118' can be achieved at the same etching and lithography processes.

Next, the second conductive layer 113' with depressions 1131' and 1133' and the cushion part 117' are formed on the first insulating layer 112' at the same step. A portion of the second conductive layer 113' fills into the depressions 1121' to electrically and physically connect the upper surface of the first semiconductor layer. A center region of the second conductive layer 113' is removed to form the rectangular ring-like depression 1131' and portions of the second conductive layer 113' are removed to form the depressions 1133'. In the embodiment, the cushion part 117' is formed in the depression 1131' and surrounded by the second conductive layer 113'. The cushion part 117' is formed on the center region of the light-emitting element 11' in a top view, and electrically isolated from the second conductive layer 113'. After the second conductive layer 113' and the cushion part 117' are formed, the second insulating layer 114' is formed on the second conductive layer 113' and the cushion part 117' and includes a plurality of depressions 1141' and 1143'. The depressions 1141' expose the second conductive layer 113'. The second insulating layer 114' fills into the depressions 1133' and 1123', covers side surfaces thereof to form the depressions 1143'. Finally, the first pad 115' and the second pad 116' are formed on the second insulating layer 114'. Herein, the first pad 115' electrically connects the second conductive layer 113' via the depressions 1141', and the second pad 116' electrically connects the first conductive layer 111' via the depressions 1143' to provide external contacts for powering the semiconductor light-emitting stack 110'. Similarly, when an ejector pin (not shown) pushes the center region of the light-emitting element 11', the cushion part 117' can absorb part of the strength from the ejector pin to prevent from conductive paths occurring between the first conductive layer 111' and the second conductive layer 113', and short circuits due to the conductive paths will not happen accordingly.

Figure 12A:
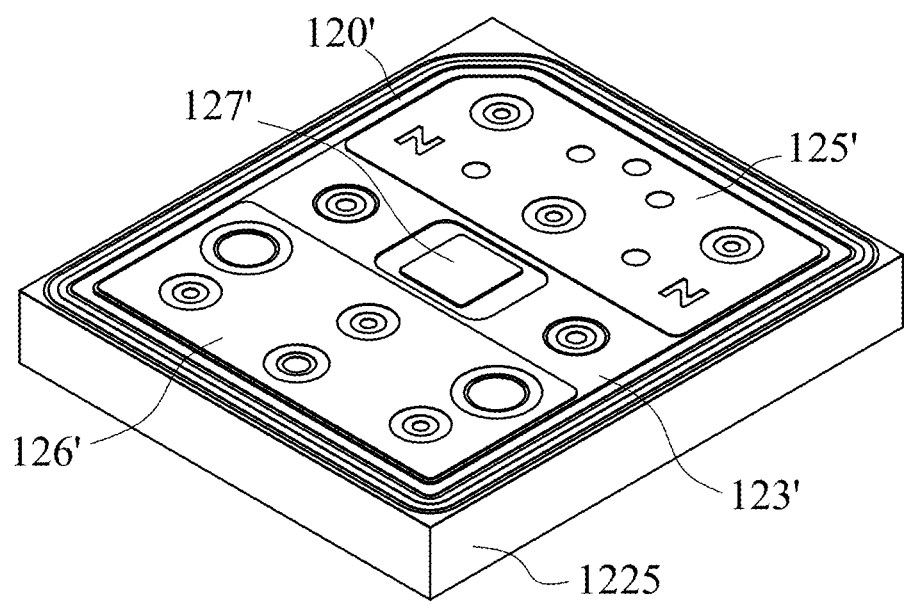
FIG. 12A shows an isometric of a light-emitting element in accordance with a tenth embodiment of the application.
Figure 12B:
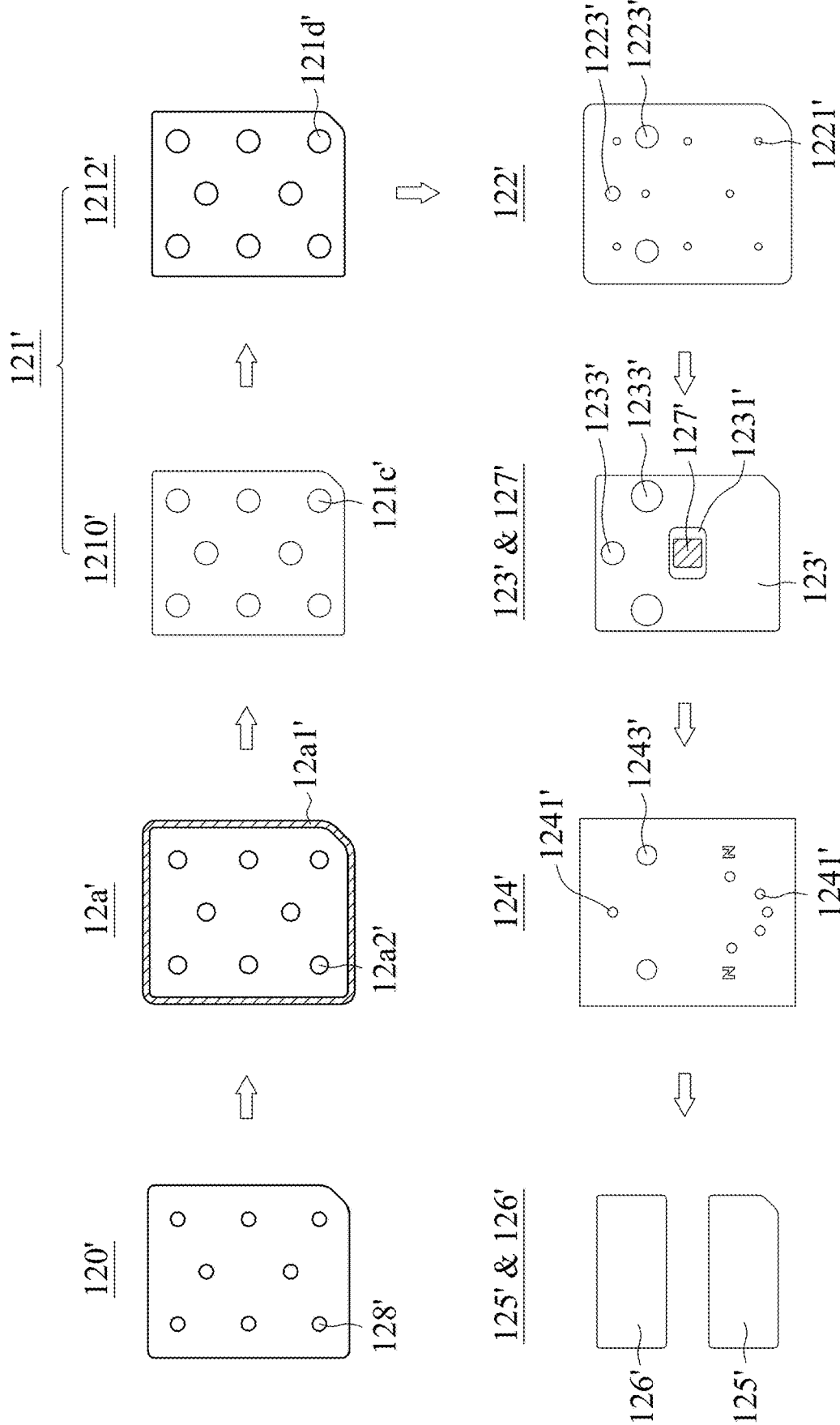
FIG. 12B shows a top view of each layer of FIG. 12A.

Referring to FIGS. 12A~12B, FIG. 12A shows an isometric view of a light-emitting element 12' in accordance with a tenth embodiment of the application and FIG. 12B shows top views of each layers of FIG. 12A. As shown in FIGS. 12A~12B, the light-emitting element 12' includes a semiconductor light-emitting stack 120', having a first semiconductor layer, an active layer and a second semiconductor layer (not shown in FIGS. 12A~12B) formed on a substrate 1225 in sequence, and depressions 128'; an insulating layer 12a', including a square ring-like region 12a1' in a top view located on the edges of the semiconductor light-emitting stack 120' and several circle ring-like regions 12a2' covering the sidewalls of the depressions 128'; a first conductive layer 121' having a first layer 1210' with depressions 121c' and a second layer 1212' with depressions 121d' on the semiconductor light-emitting stack 120'; a first insulating layer 122' with depressions 1221' and 1223' on the first conductive layer 121'; a cushion part 127' and a second conductive layer 123' with depressions 1231' and 1233' on the first insulating layer 122'; a second insulating layer 124' with depressions 1241' and 1243' on the second conductive layer 123'; and a first pad 125' and a second pad 126' on the second insulating layer 124'. In the embodiment, a shape of the cushion part 127' in a top view includes a rectangular shape. Additionally, steps of forming the light-emitting element 12' are similar to that of the light-emitting element 11'. For clarifying, similar descriptions are omitted herein.

Similarly, when an ejector pin (not shown) pushes the center region of the light-emitting element 12', the cushion part 127' can absorb part of the strength from the ejector pin to prevent from conductive paths occurring between the first conductive layer 121' and the second conductive layer 123', and short circuits due to the conductive paths will not happen accordingly.

Figure 13A:
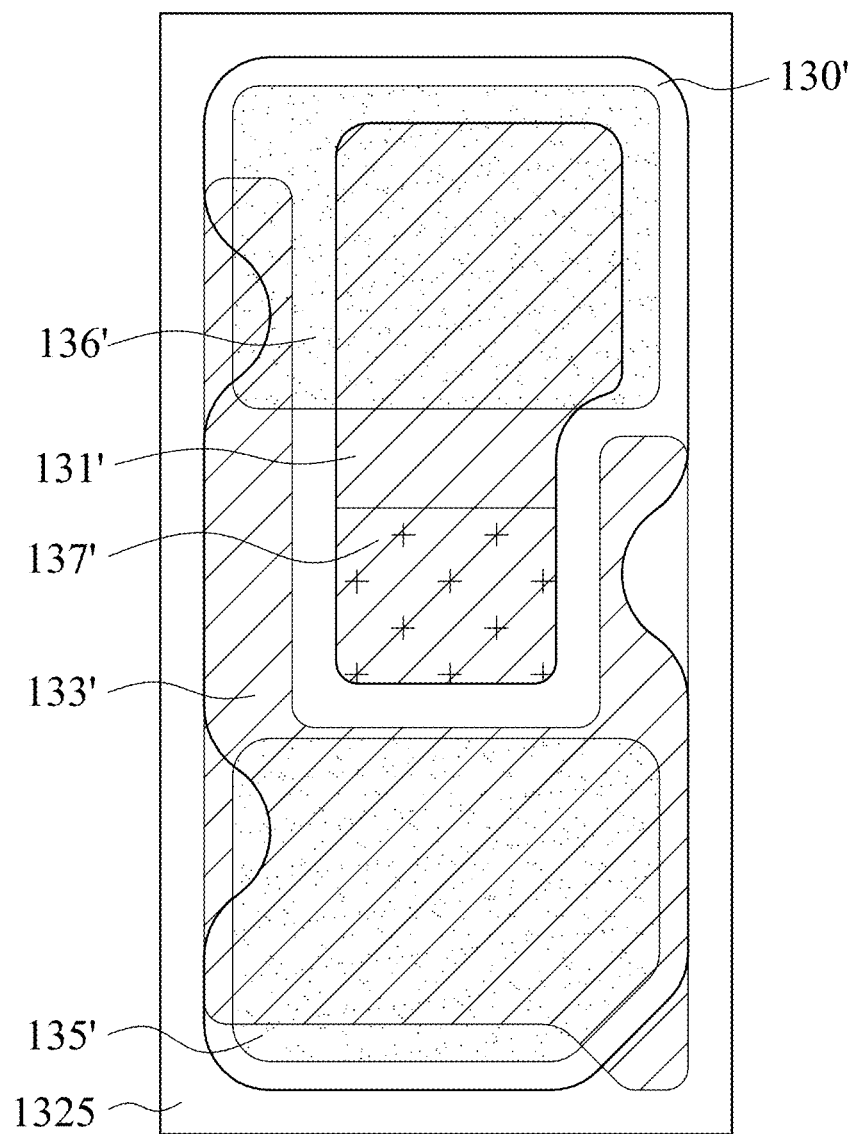
FIG. 13A shows a top view of a light-emitting element in accordance with an eleventh embodiment of the application.

FIG. 13A shows a top view of a light-emitting element 13' in accordance with an eleventh embodiment of the application. The light-emitting element 13' includes a semiconductor light-emitting stack 130' on a substrate 1325, a first conductive layer 131' on the semiconductor light-emitting stack 130', a first insulating layer (not shown) on the first conductive layer 131', a second conductive layer 133' on the first insulating layer, a second insulating layer (not shown) on the second conductive layer 133', a first pad 135', a second pad 136', and a cushion part 137' electrically connects the first conductive layer 131'. Herein, a shape of the cushion part 137' in a top view includes a rectangular shape. The structure and material of the cushion part 137' is similar as that of the cushion part 97 in the seventh embodiment, and a detailed description is omitted herein.

Figure 13B:
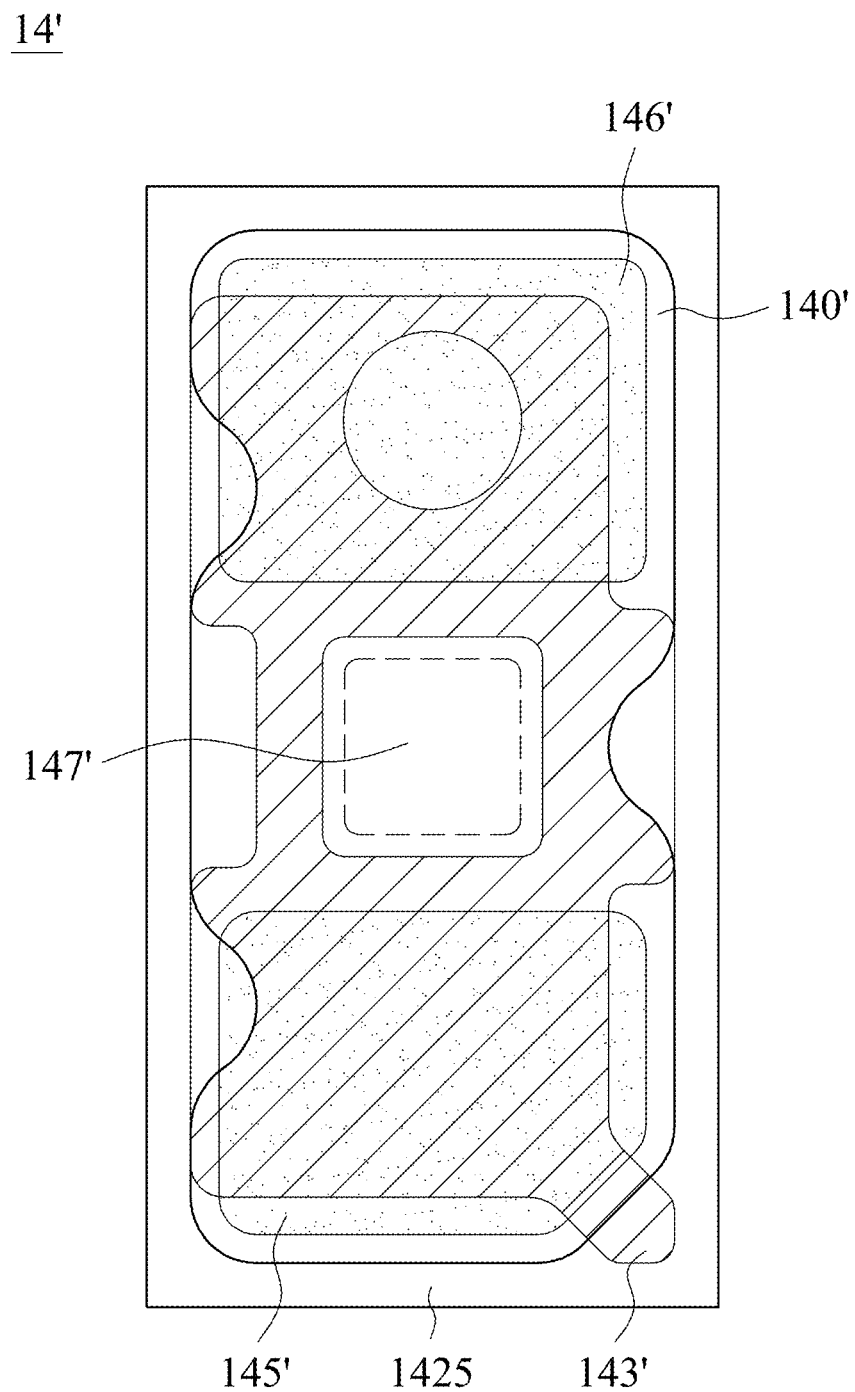
FIG. 13B shows a top view of a light-emitting element in accordance with a twelfth embodiment of the application.

FIG. 13B shows a top view of a light-emitting element 14' in accordance with a twelfth embodiment of the application. The light-emitting element 14' includes a semiconductor light-emitting stack 140' on a substrate 1425, a first conductive layer (not shown) on the semiconductor light-emitting stack 140', a first insulating layer (not shown) on the first conductive layer, a second conductive layer 143' with an irregular shape formed on the first insulating layer, a second insulating layer (not shown) on the second conductive layer 143', a first pad 145', a second pad 146', and a cushion part 147' formed in a center region without being covered by the second conductive layer 143'. At least a portion of the first insulating layer and the second insulating layer are formed in a center region of the light-emitting element 14' and the material of the cushion part 147' is the same as that of the first insulating layer or the second insulating layer. The structure, location, and material of the cushion part 147' are similar as that of the cushion part 67 in the fourth embodiment, and a detailed description is omitted herein.

Figure 13C:
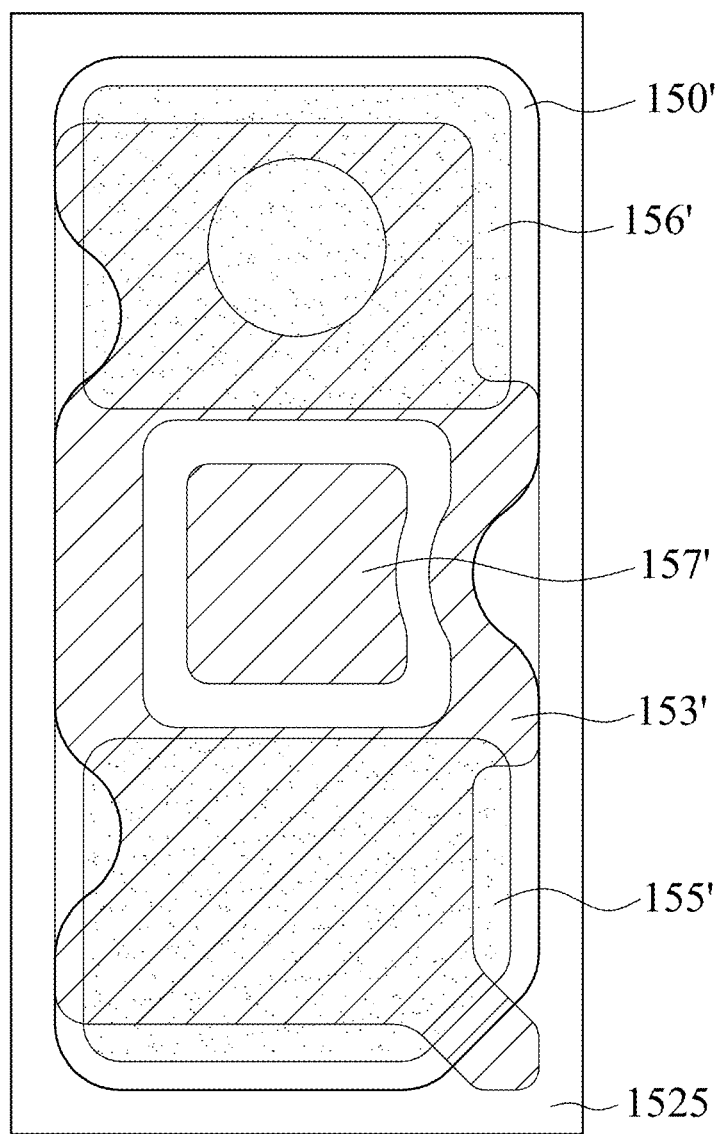
FIG. 13C shows a top view of a light-emitting element in accordance with a thirteenth embodiment of the application.

FIG. 13C shows a top view of a light-emitting element 15' in accordance with a thirteenth embodiment of the application. The light-emitting element 15' includes a semiconductor light-emitting stack 150' on a substrate 1525, a first conductive layer (not shown) on the semiconductor light-emitting stack 150', a first insulating layer (not shown) on the first conductive layer, a second conductive layer 153' on the first insulating layer, a second insulating layer (not shown) on the second conductive layer 153', a first pad 155', a second pad 156', and a cushion part 157'. The cushion part 157' is formed on the second insulating layer and located in a center region without being covered by the second conductive layer 153'. In the embodiment, a portion of the second conductive layer 153' is removed and the shape of the removed portion of the second conductive layer 153' is irregular. A shape of cushion part 157' corresponds to the shape of the removed portion of the second conductive layer 153' and includes an irregular shape. Similarly, when an ejector pin (not shown) pushes a center region of the light-emitting element 15', the cushion part 157' can absorb part of the strength from the ejector pin to prevent from conductive paths occurring between the first conductive layer and the second conductive layer 153', and short circuits due to the conductive paths will not happen accordingly.

In above embodiments (the eleventh embodiment to the thirteen embodiment), when an ejector pin (not shown) pushes the light-emitting element, the cushion part can absorb part of the strength from the ejector pin to prevent from conductive paths occurring between the first conductive layer and the second conductive layer, and short circuits due to the conductive paths will not happen accordingly.

FIG. 14 shows testing data presenting short-circuit ratios of light-emitting elements of the first embodiment and a conventional light-emitting element. As shown in FIG. 14, testing quantity of the light-emitting element of the first embodiment and the conventional light-emitting element are 846 and 234 respectively. Short-circuit ratios of the light-emitting element of the first embodiment and the conventional light-emitting element are zero and 33%. Therefore, the light-emitting element of the application can prevent short circuits due to the damage in the detaching process.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting element comprises:
   a semiconductor light-emitting stack comprising a first semiconductor layer, a second semiconductor layer formed on the first semiconductor layer, and an active layer formed therebetween;
   a first depression penetrating the second semiconductor layer, the active layer, and the first semiconductor layer;
   a first conductive layer formed on the second semiconductor layer;
   a first insulating layer comprising a second depression disposed on the second semiconductor layer;
   a second conductive layer formed on the second semiconductor layer and being devoid of directly contacting the first conductive layer, wherein the second conductive layer comprises a third depression at a center region of the light-emitting element;
   a first pad disposed on the first insulating layer and electrically connecting to the first semiconductor layer;
   a second pad disposed on the first insulating layer and electrically connecting to the second semiconductor; and
   a cushion part disposed between the first pad and the second pad, wherein in a top view, the cushion part is disposed corresponding to the third depression.

2. The light-emitting element of claim 1, further comprising a plurality of first depressions, wherein the third depression is located between the plurality of first depressions.

3. The light-emitting element of claim 1, wherein the material of the cushion part comprises metal.

4. The light-emitting element of claim 1, wherein the material of the cushion part comprises insulating material.

5. The light-emitting element of claim 1, wherein the cushion part is electrically isolated from the first conductive layer and the second conductive layer.

6. The light-emitting element of claim 1, wherein the first insulating layer covers a side wall of the first depression.

7. The light-emitting element of claim 1, wherein a shape of the cushion part comprises a symmetrical shape in the top view.

8. The light-emitting element of claim 1, wherein the cushion part is substantially coplanar with the second conductive layer.

9. The light-emitting element of claim 1, wherein the cushion part comprises a first top surface, one of the first pad and the second pad comprises a second top surface, and the first top surface is below the second top surface in a cross-sectional view.

10. The light-emitting element of claim 1, wherein the cushion part is in direct contact with the first insulating layer.

11. The light-emitting element of claim 1, wherein the cushion part is disposed in the third depression.

12. The light-emitting element of claim 1, further comprising a second insulating layer disposed on the first insulating layer, wherein the first pad and the second pad are disposed on the second insulating layer.

13. The light-emitting element of claim 12, wherein the cushion part is interposed between the first insulating layer and the second insulating layer in a cross-sectional view.

14. The light-emitting element of claim 12, wherein the second insulating layer comprises a fourth depression aligned with the second depression, and the second pad electrically connects the second semiconductor layer via the fourth depression.

15. The light-emitting element of claim 12, wherein the cushion part comprises a material same as that of the second insulating layer.

16. The light-emitting element of claim 1, wherein the second conductive layer comprise an outermost edge excessing over an outermost edge of the active layer in a cross-sectional view.

17. The light-emitting element of claim 1, wherein the cushion part comprises a material same as that of the first insulating layer.

18. The light-emitting element of claim 1, wherein the second conductive layer fills into the first depression.

19. The light-emitting element of claim 1, wherein the first conductive layer is devoid of filling into the first depression.

20. The light-emitting element of claim 1, wherein the cushion part comprises an area less than the first pad or the second pad in the top view.

* * * * *